USO12408543B2

(12) United States Patent
Roh et al.

(10) Patent No.: US 12,408,543 B2
(45) Date of Patent: Sep. 2, 2025

(54) DISPLAY DEVICE HAVING MULTI-WIDTH HOLE AREA

(71) Applicant: Samsung Display Co., LTD., Yongin-si (KR)

(72) Inventors: Jong Duk Roh, Yongin-si (KR); Kwang Min Lee, Goyang-si (KR); Sang Ik Lee, Gwangmyeong-si (KR); Jae Ku Han, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 587 days.

(21) Appl. No.: 17/672,333

(22) Filed: Feb. 15, 2022

(65) Prior Publication Data
US 2022/0263050 A1 Aug. 18, 2022

(30) Foreign Application Priority Data
Feb. 18, 2021 (KR) .................. 10-2021-0021701

(51) Int. Cl.
*H10K 50/84* (2023.01)
*H10K 50/844* (2023.01)
(Continued)

(52) U.S. Cl.
CPC ........... *H10K 77/10* (2023.02); *H10K 50/844* (2023.02); *H10K 59/122* (2023.02);
(Continued)

(58) Field of Classification Search
CPC ...... H10K 50/844; H10K 50/15; H10K 50/16; H10K 50/17; H10K 50/171; H10K 50/8426; H10K 50/868; H10K 50/865; H10K 59/122; H10K 59/8731; H10K 59/8791; H10K 59/88; H10K 59/65; H10K 59/124;
(Continued)

(56) References Cited

U.S. PATENT DOCUMENTS 10,230,069 B2 *  3/2019  Choi .................... H10K 59/873
10,680,205 B2 *  6/2020  Choi .................... H10K 59/873
(Continued)

FOREIGN PATENT DOCUMENTS

CN     108828823 A  * 11/2018  ........... G02F 1/1333
CN     111739914 A  * 10/2020  ......... H01L 27/3234
(Continued)

OTHER PUBLICATIONS

Dudutis, J., et al., "Bessel Beam asymmetry control for glass dicing applications," ScienceDirect, Procedia CIRP 74 (2018), pp. 333-338.
(Continued)

*Primary Examiner* — Ida M Soward
(74) *Attorney, Agent, or Firm* — Womble Bond Dickinson (US) LLP

(57) ABSTRACT

A display device including a substrate and a stacked structure on the substrate. The substrate has a first hole, and the stacked structure has a second hole. The second hole partially overlaps the first hole and has an edge outside the first hole in a plan view. The substrate has a substrate exposed portion exposed to the second hole, and the substrate exposed portion is partially depressed in an edge direction of the second hole.

18 Claims, 22 Drawing Sheets

(51) Int. Cl.
| | |
|---|---|
| *H10K 59/12* | (2023.01) |
| *H10K 59/122* | (2023.01) |
| *H10K 59/80* | (2023.01) |
| *H10K 71/00* | (2023.01) |
| *H10K 77/10* | (2023.01) |
| *H10K 50/15* | (2023.01) |
| *H10K 50/16* | (2023.01) |
| *H10K 50/17* | (2023.01) |
| *H10K 50/80* | (2023.01) |
| *H10K 50/842* | (2023.01) |
| *H10K 50/86* | (2023.01) |
| *H10K 59/124* | (2023.01) |
| *H10K 59/126* | (2023.01) |
| *H10K 59/40* | (2023.01) |
| *H10K 59/65* | (2023.01) |
| *H10K 59/88* | (2023.01) |
| *H10K 102/00* | (2023.01) |

(52) U.S. Cl.
CPC ......... *H10K 59/8731* (2023.02); *H10K 71/00* (2023.02); *H10K 50/15* (2023.02); *H10K 50/16* (2023.02); *H10K 50/17* (2023.02); *H10K 50/171* (2023.02); *H10K 50/8426* (2023.02); *H10K 50/865* (2023.02); *H10K 50/868* (2023.02); *H10K 59/12* (2023.02); *H10K 59/1201* (2023.02); *H10K 59/124* (2023.02); *H10K 59/126* (2023.02); *H10K 59/40* (2023.02); *H10K 59/65* (2023.02); *H10K 59/8791* (2023.02); *H10K 59/88* (2023.02); *H10K 2102/311* (2023.02)

(58) Field of Classification Search
CPC ...... H10K 59/12; H10K 59/40; H10K 59/126; H10K 77/10; H10K 2102/311
See application file for complete search history.

(56) References Cited

U.S. PATENT DOCUMENTS

| | | | | |
|---|---|---|---|---|
| 10,955,965 | B2* | 3/2021 | Park | G06F 3/0412 |
| 11,054,950 | B2 | 7/2021 | Eom et al. | |
| 11,121,343 | B2* | 9/2021 | Kanaya | H10D 30/6732 |
| 11,435,858 | B2 | 9/2022 | Eom et al. | |
| 11,462,714 | B2 | 10/2022 | Yun et al. | |
| 2015/0034935 | A1* | 2/2015 | Choi | H10K 77/111 |
| | | | | 257/40 |
| 2015/0048329 | A1* | 2/2015 | Kim | H10K 77/111 |
| | | | | 257/40 |
| 2018/0151834 | A1* | 5/2018 | Kanaya | H10D 30/6746 |
| 2019/0148672 | A1* | 5/2019 | Seo | H10K 59/879 |
| | | | | 257/40 |
| 2020/0044006 | A1* | 2/2020 | Lee | H10K 59/131 |
| 2020/0135800 | A1* | 4/2020 | Seo | H10H 20/857 |
| 2020/0264715 | A1* | 8/2020 | Eom | H10K 77/10 |
| 2020/0303684 | A1* | 9/2020 | Kim | H10K 50/844 |
| 2021/0233991 | A1* | 7/2021 | Lee | H10K 59/12 |
| 2022/0143757 | A1 | 5/2022 | Roh et al. | |
| 2022/0173205 | A1* | 6/2022 | Cha | H10K 59/1213 |
| 2022/0416206 | A1 | 12/2022 | Yun et al. | |

FOREIGN PATENT DOCUMENTS

| | | | | |
|---|---|---|---|---|
| CN | 111799304 A | * | 10/2020 | ....... G02F 1/136209 |
| JP | 2020-196665 A | | 12/2020 | |
| KR | 10-2007-0071283 A | | 7/2007 | |
| KR | 10-2016-0114296 A | | 10/2016 | |
| KR | 10-2017-0131586 A | | 11/2017 | |
| KR | 10-2020-0044442 A | | 4/2020 | |
| KR | 10-2020-0099231 A | | 8/2020 | |
| KR | 10-2020-0102036 A | | 8/2020 | |
| KR | 10-2022-0063842 A | | 5/2022 | |

OTHER PUBLICATIONS

Kim, K-R, "Femto-Second Laser Glass Cutting for Flat Panel Display," Kor J. Mater. Res., vol. 18, No. 5, (2008), 6 pages.

"Glass Cutting with UV Lasers," Application Focus, Industrial Laser/Application Lab, Spectra-Physics, A Newport Corporation Brand, Jun. 2011, 2 pages.

Kim, J.G., et al., "Micromachining Characteristics inside Transparent Materials Using Femtoseocond Laser Pulses," Journal of the Korean Society of Precision Engineering, vol. 23, No. 5, May 2006, 7 pages.

Mishchik, K. et al., "Ultrashort Pulse Laser Cutting of Glass by Controlled Fracture Propagation," HAL archives-ouvertes.fr, https://hal.archives-ouvertes.fr/hal-01321979, May 26, 2016, 6 pages.

Choi, W.S. et al., "A Study for Formation of Filament Using Femtosecond Laser Pulse Control in Transparent Glass," 2015, 1 page.

* cited by examiner

NFA: NFA1, NFA2

NFA: NFA1, NFA2

120: 121
130: 131a, 131b, 131c
140: 141
150: 151, 152
EMD: 171, 172, 173
LS: 111, 112, 113, 120, 130, 140, 150,
    161a, 162a, 163a, 171, 172, 173, 180, AL, 200

DISPLAY DEVICE HAVING MULTI-WIDTH HOLE AREA

CROSS-REFERENCE TO RELATED APPLICATION

This application claims priority to and the benefit of Korean Patent Application No. 10-2021-0021701, filed on Feb. 18, 2021, in the Korean Intellectual Property Office, the contents of which in its entirety are herein incorporated by reference.

BACKGROUND

1. Field

Aspects of embodiments of the present disclosure relate to a display device and a method for manufacturing the same.

2. Description of the Related Art

The importance of display devices has steadily increased with the development of multimedia technology. In response thereto, various types of display devices, such as an organic light emitting diode (OLED) display, a liquid crystal display (LCD), and the like have been used. Such display devices have been variously applied to various mobile electronic devices, for example, portable electronic devices, such as a smart phone, a smart watch, and a tablet PC.

Recently, components for implementing various functions other than image display tend to be mounted on the display device. A smartphone equipped with optical elements, such as a camera, an infrared sensor, and the like, is an example of such other components. The display device may include an optical opening (e.g., an optical hole) through which the optical element receives light. Some elements of the display device are physically perforated to increase the transmittance through the optical openings.

SUMMARY

Aspects of the present disclosure provide a display device having an opening (e.g., a hole) in an active area for displaying an image while the size of the active area is increased or maximized.

Aspects of the present disclosure also provide a method for manufacturing a display device capable of reducing damage that may occur to the display device during the formation of the opening by forming the opening, which is in an active area for displaying an image, without physical contact.

An embodiment of a display device includes a substrate having a first hole and a stacked structure on the substrate. The stacked structure has a second hole, and the second hole partially overlaps the first hole and has an edge outside the first hole in plan view. The substrate has a substrate exposed portion exposed to the second hole, and the substrate exposed portion is partially depressed in an edge direction of the second hole.

Another embodiment of a display device includes a substrate and a stacked structure on the substrate. The substrate has a first hole and a substrate exposed portion adjacent to the first hole, and the stacked structure has a second hole partially overlapping the first hole. A first angle formed by a side surface of the substrate exposed portion defining the first hole and a bottom surface of the substrate exposed portion is greater than a second angle formed by a side surface of the stacked structure defining the second hole and a top surface of the substrate exposed portion.

An embodiment of a method for manufacturing a display device includes: preparing a target substrate including a base substrate and a stacked structure on the base substrate; forming a groove to expose the base substrate by irradiating a first laser beam, which is a donut beam having a minimum energy value at a center of a beam spot at a focal point, onto the stacked structure of the target substrate along a cutting line while scanning the target substrate; forming a cutting hole by irradiating a second laser beam, which is a Bessel beam, onto the base substrate exposed by the groove along the cutting line so as to be separated on a spot basis; and forming a cutting crack by irradiating a third laser beam, which is the donut beam, onto the base substrate exposed by the groove along the cutting line while scanning the target substrate.

However, aspects and features of the present disclosure are not restricted to those set forth herein. The above and other aspects and features of the present disclosure will become more apparent to one of ordinary skill in the art to which the present disclosure pertains by referencing the detailed description of the present disclosure given below.

A display device according to embodiments has a hole in (e.g., surrounded by) an active area at where an image is displayed, and the size of the active area may be increased or maximized.

In a method for manufacturing the display device according to an embodiment, a hole in (e.g., surrounded by) an active area for displaying an image may be formed without physical contact, thereby reducing damage that may occur to the display device when the hole is formed.

The aspects and features of the present disclosure are not limited to the aforementioned aspects and features, and various other aspects and features are included in the present specification.

BRIEF DESCRIPTION OF THE DRAWINGS

The above and other aspects and features of the present disclosure will become more apparent by describing, in detail, embodiments thereof with reference to the attached drawings, in which.

DETAILED DESCRIPTION

Figure 1:
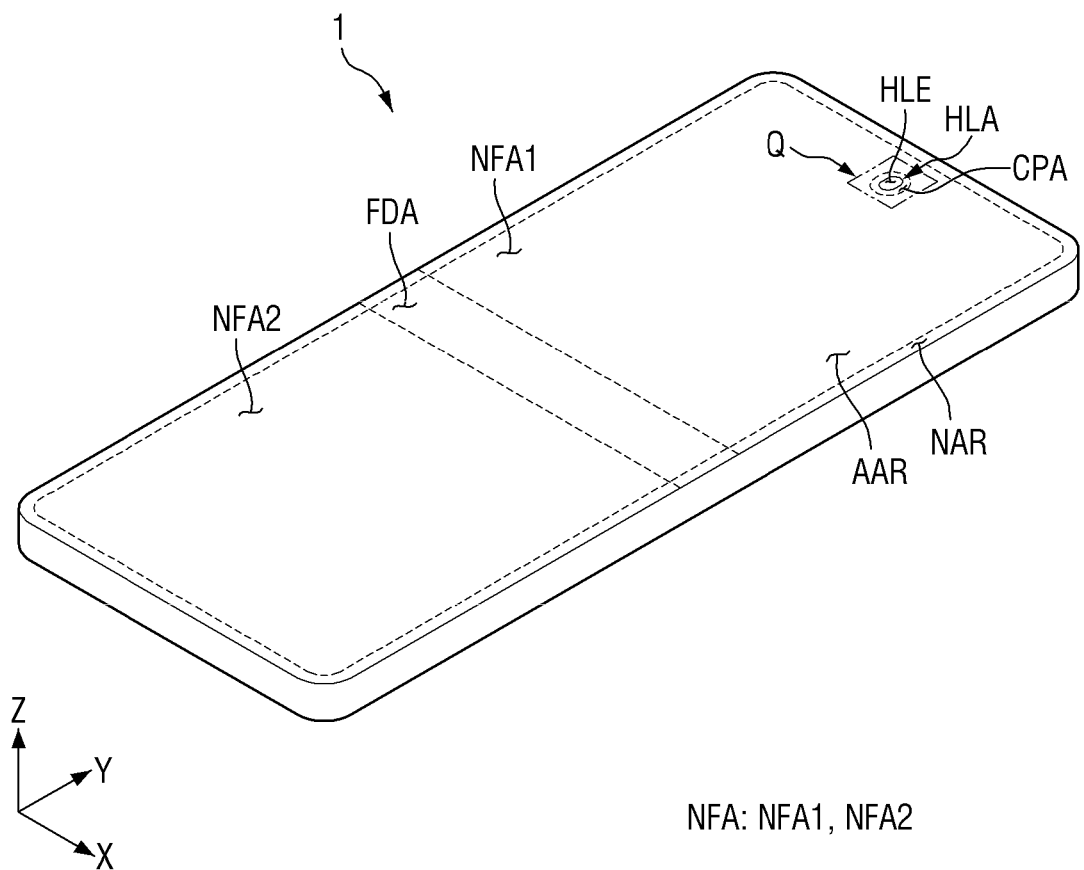
FIG. 1 is a plan view of a display device according to an embodiment.

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein interpreted accordingly.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments will be described in detail with reference to the accompanying drawings.

FIG. 1 is a plan view of a display device according to an embodiment.

Referring to FIG. 1, a first direction X may be a direction parallel to one side of a display device 1 in plan view (e.g., in a plan view) and may be, for example, a horizontal direction of the display device 1. A second direction Y may be a direction parallel to the other side in contact with (or extending from) the one side of the display device 1 in plan view and may be, for example, a vertical direction of the display device 1. A third direction Z may be a thickness direction of the display device 1. It should be understood, however, that the directions mentioned herein refer to relative directions and the embodiment is not limited to the directions mentioned.

The display device 1 according to an embodiment displays an image at an active area AAR to be described later, and various devices including the active area AAR may be included therein.

For example, the display device 1 according to embodiments of the present disclosure may be applied to a smartphone, a mobile phone, a tablet PC, a personal digital assistant (PDA), a portable multimedia player (PMP), a television, a game machine, a wristwatch-type electronic device, a head-mounted display, a monitor of a personal computer, a laptop computer, a car navigation system, a car's dashboard, a digital camera, a camcorder, an external billboard, an electronic billboard, a medical device, an inspection device, various household appliances, such as a refrigerator and a washing machine, or an Internet-of-Things (IoT) device.

The display device 1 may have a rectangular or square shape in plan view. The display device 1 may have a rectangular shape with right-angled or rounded corners in plan view. The display device 1 may have two long sides respectively disposed on one side and the other side in the horizontal direction (e.g., the first direction X) and two short sides respectively disposed on one side and the other side in the vertical direction (e.g., the second direction Y).

The display device 1 has an active area AAR and a non-active area NAR. The active area AAR of the display device 1 may include a display area for displaying an image. Further, when the display device 1 has a touch function, a touch area, which is an area where a touch input is sensed, may also be included in the active area AAR.

The planar shape of the active area AAR may correspond to the planar shape of the display device 1 to which the active area AAR is applied. For example, when the display device 1 is rectangular in plan view, the planar shape of the active area AAR may also be rectangular.

A plurality of pixels may be arranged in the active area AAR. The plurality of pixels may be arranged in a matrix. The shape of each pixel may be a rectangular or square shape in plan view. However, the present disclosure is not limited thereto.

The non-active area NAR may be disposed around the active area AAR. The non-active area NAR may surround (e.g., may extend around a periphery of) the active area AAR. The non-active area NAR may include a non-display area where no display is performed (e.g., where no image is displayed). The non-active area NAR may surround (e.g., may extend along) all sides of the active area AAR, but the present disclosure is not limited thereto. The non-active area NAR may not be disposed in the vicinity of at least a part of the four sides of the active area AAR. A bezel area of the display device 1 may be configured as the non-active area NAR.

The display device 1 may include a hole area (e.g., an opening area) HLA including at least one hole (e.g., an opening) HLE. The term "hole" as used herein is not intended to, and should not be interpreted as meaning, only a circularly shaped opening and can indicate openings having various suitable shapes. The hole area HLA transmits light to a light receiving portion of an optical element disposed to overlap the hole area HLA in the thickness direction (e.g., the third direction Z). In the drawings, the display device 1 is illustrated as including one hole area HLA but is not limited thereto. The display device 1 may include a plurality of hole areas HLA.

The hole area HLA may be disposed inside the active area AAR. The hole area HLA may be at least partially surrounded by the active area AAR (e.g., the active area AAR may extend at least partially around a periphery of the hole area HLA). Although the active area AAR is illustrated as completely surrounding the periphery of the hole area HLA in the drawing, a part of the hole area HLA may be connected to the non-active area NAR disposed at the periphery (or edges) of the active area AAR. The hole area HLA may correspond to the non-active area NAR where no display is performed, although it is not limited thereto.

The display device 1 may be a foldable display device. As used herein, the term "foldable display device" refers to the display device 1 which can be folded and may have both a folded state and an unfolded state. Further, the folding typically includes folding at an angle of about 180 degrees. However, the present disclosure is not limited thereto, and it may include a case where the folding angle exceeds 180 degrees or is less than 180 degrees, for example, a case where the folding angle is equal to or greater than 90 degrees and less than 180 degrees, or a case where the folding angle is equal to or greater than 120 degrees and less than 180 degrees. In addition, it may be referred to as a folded state if folding is performed out of the unfolded state, even if complete folding is not performed. For example, even if it is folded at an angle of 90 degrees or less, as long as the maximum folding angle becomes 90 degrees or more, it may be expressed as being in a folded state to distinguish it from the unfolded state.

Figure 2:
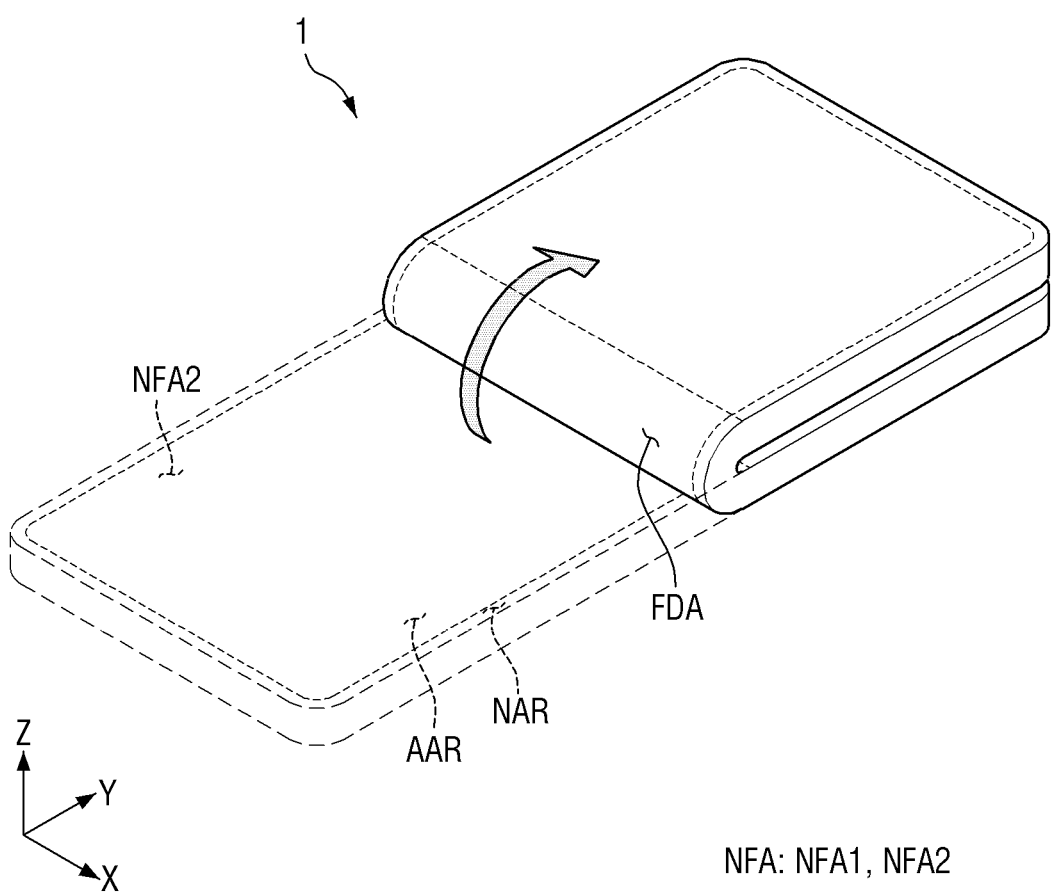
FIG. 2 is a perspective view illustrating the display device shown in FIG. 1 in a folded state.

The display device 1 may have a folding area (e.g., a folding line) FDA. The display device 1 may be folded with respect to the folding area FDA. The folding may be in-folding, in which the display surface of the display device 1 is folded inwardly, and out-folding, in which the display surface of the display device 1 is folded outwardly. Although the display device 1 is illustrated as being in-folded in FIG. 2, the present disclosure is not limited thereto. The display device 1 may be folded in an out-folding manner.

Further, the display device 1 may be folded in only one manner, e.g., an in-folding manner or out-folding manner. Alternatively, both the in-folding and the out-folding may be performed. In the case of the display device in which both in-folding and out-folding are performed, in-folding and out-folding may be performed with respect to the same folding area FDA. Alternatively, it may include a plurality of folding areas, such as a folding area for in-folding only and a folding area for out-folding only, which are used to perform different types of folding.

The folding area FDA may have an extending direction (e.g., may extend) parallel to one side of the display device 1. For example, the folding area FDA may extend in the same direction as a horizontal direction of the display device 1 (e.g., the first direction X). When the display device 1, which is illustrated in the drawing as having a rectangular shape in which the sides in the vertical direction (e.g., the second direction Y) are longer than the sides in the horizontal direction (e.g., the first direction X) as an example, has the folding area FDA extending in the horizontal direction (e.g., the first direction X), the long sides of the display device 1 may be reduced to half or less, whereas the short sides thereof may remain the same, after the display device 1 is folded. In another embodiment, the folding area FDA may extend in the same direction as the extension direction of the long sides (e.g., the second direction Y).

The folding area FDA may also have a width (e.g., a predetermined width) in the second direction Y. The width of the folding area FDA in the second direction Y may be smaller than its width in the first direction X.

The display device 1 may have a non-folding area NFA disposed around the folding area FDA. The non-folding area NFA may have a first non-folding area NFA1 located on one side of the folding area FDA in the second direction Y and a second non-folding area NFA2 located on the other side of the folding area FDA in the second direction Y. The widths of the first non-folding area NFA1 and the second non-folding area NFA2 in the second direction Y may be equal or substantially equal to each other, but the present disclosure is not limited thereto. The width of the first non-folding area NFA1 and the width of the second non-folding area NFA2 may be different from each other according to the position of the folding area FDA.

The active area AAR/non-active area NAR and the folding area FDA/non-folding area NFA of the display device 1 described above may overlap each other at the same position. For example, a specific position may be located in the active area AAR and also located in the first non-folding area NFA1. Another specific position may be located in the non-active area NAR and also located in the first non-folding area NFA1. Still another specific position may be located in the active area AAR and also located in a region including the folding area FDA.

The active area AAR of the display device 1 may be disposed over (e.g., may extend through) both the first non-folding area NFA1 and the second non-folding area NFA2. Further, the active area AAR may be located even in the folding area FDA corresponding to a boundary between the first non-folding area NFA1 and the second non-folding area NFA2. For example, the active area AAR of the display device 1 may be continuously arranged irrespective of boundaries of the non-folding area NFA, the folding area FDA, and the like. However, the present disclosure is not limited thereto. The active area AAR may be located in only one of the first non-folding area NFA1 and the second non-folding area NFA2. The active area AAR may be disposed in the first non-folding area NFA1 and the second non-folding area NFA2, and the active area AAR may not be disposed in the folding area FDA.

The hole area HLA may be disposed in at least one of the first non-folding area NFA1 and the second non-folding area NFA2. For example, the hole area HLA may be disposed in the first non-folding area NFA1, although it is not limited thereto. The hole area HLA is spaced apart from the folding area FDA.

Hereinafter, the cross-sectional structure of the above-described display device 1 will be described.

Figure 3:
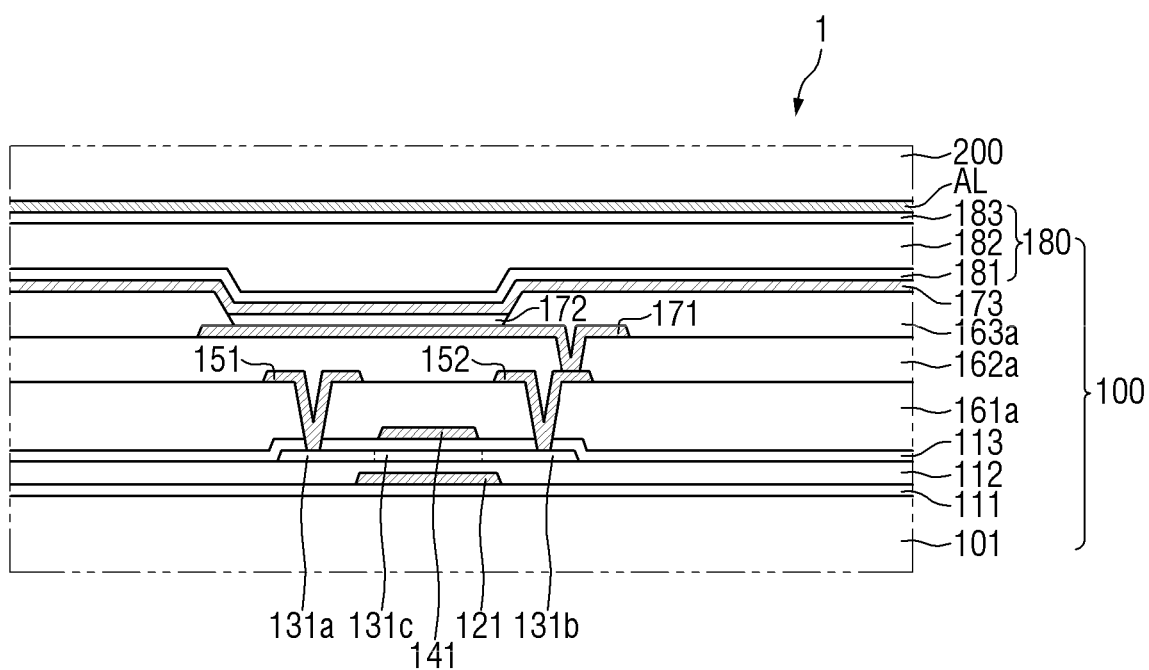
FIG. 3 is a cross-sectional view of one pixel of the display device shown in FIG. 1.

FIG. 3 is a cross-sectional view of one pixel of the display device shown in FIG. 1.

Referring to FIG. 3, the display device 1 according to an embodiment may include a display panel 100 and a polarization member 200 disposed above the display panel 100. FIG. 3 illustrates a partial cross-sectional structure of the display device 1 constituting one pixel disposed in the active area AAR. In addition, although the display device 1 including the display panel 100 and the polarization member 200 is illustrated in FIG. 3, the present disclosure is not limited thereto. Other members, such as a buffer member and a heat dissipation member, may be further disposed on the other side surface of the display panel 100 in the third direction Z, and a cover window and a window protection member may be further disposed on one side surface of the display panel 100 in the third direction Z.

The display panel 100 included in the display device 1 according to an embodiment may include a plurality of stacked structures.

A base substrate 101, a barrier layer 111, a first conductive layer 120, a buffer layer 112, a semiconductor layer 130, a first insulating layer 113, a second conductive layer 140, a second insulating layer 161, a third conductive layer 150, a third insulating layer 162, a pixel electrode 171, a fourth insulating layer 163, a light emitting layer 172, a common electrode 173, and a thin film encapsulation layer 180 may be sequentially disposed in the display panel 100. Each of the layers described above may consist of a single layer or a stack of a plurality of layers. Other layers may be further disposed between the layers.

The base substrate 101 supports the respective layers disposed thereon. The base substrate 101 may include (or may be formed by including), for example, ultra-thin glass (UTG) or thin glass. The ultra-thin glass may be strengthened to have a stress profile (e.g., a predetermined stress profile) therein. The strengthened ultra-thin glass more efficiently prevents or impedes generation of cracks, propagation of cracks, breakage, and the like due to external impact than before strengthening. The ultra-thin glass strengthened by a strengthening process may have a different stress for each region.

When the glass is ultra-thin glass or thin glass, it may have a flexible property so that it can be curved, bent, folded, or rolled. The thickness of the glass may be, for example, in a range of about 10 μm to about 300 μm, about 10 μm to about 100 μm, or about 50 μm.

The glass of the base substrate 101 may include soda-lime glass, alkali aluminosilicate glass, borosilicate glass, or lithium alumina silicate glass. The glass of the base substrate 101 may include chemically strengthened or thermally strengthened glass to have improved strength and impact resistance.

The barrier layer 111 may be disposed on the base substrate 101. The barrier layer 111 may prevent or substantially prevent diffusion of impurity ions, prevent or substantially prevent permeation of moisture or external air, and perform a surface planarization function. The barrier layer 111 may include silicon nitride, silicon oxide, silicon oxynitride, or the like. The barrier layer 111 may be omitted depending on the type of the base substrate 101, process conditions, and the like.

A first conductive layer 120 may be disposed on the barrier layer 111. The first conductive layer 120 may include a light blocking pattern 121. The light blocking pattern 121 may block or substantially block irradiation of external light to a channel region 131c of a semiconductor pattern 131a, 131b, and 131c, to be described later, thereby preventing or substantially preventing a photocurrent from flowing through the channel region 131c.

The buffer layer 112 may be disposed on the first conductive layer 120. The buffer layer 112 may include at least one of silicon nitride, silicon oxide, or silicon oxynitride. The buffer layer 112 may be omitted depending on the type of the base substrate 101, process conditions, and the like.

The semiconductor layer 130 may be disposed on the buffer layer 112. The semiconductor layer 130 may include the semiconductor pattern 131a, 131b, and 131c.

The semiconductor pattern 131a, 131b, and 131c may include the channel region 131c overlapping in a thickness direction a gate electrode 141, which will be described later, disposed thereabove, and a first source/drain region 131a and a second source/drain region 131b respectively disposed to one side and the other side of the channel region 131c. The first and second source/drain regions 131a and 131b may include a plurality of carrier ions and may have high conductivity and low electric resistance in comparison with the channel region 131c. The semiconductor layer 130 may include (or may be made of) polycrystalline silicon, monocrystalline silicon, amorphous silicon, or the like.

The first insulating layer 113 may be disposed on the semiconductor layer 130. The first insulating layer 113 is a gate insulating layer and may be disposed substantially over the entire surface of the base substrate 101. The first insulating layer 113 may include a silicon compound, a metal oxide, or the like.

The second conductive layer 140 may be disposed on the first insulating layer 113. The second conductive layer 140 is a gate conductive layer and may include the gate electrode 141.

The second insulating layer 161 may be disposed on the second conductive layer 140. The second insulating layer 161 may include a silicon compound, a metal oxide, or the like. The second insulating layer 161 may include an interlayer insulating pattern 161a, The interlayer insulating pattern 161a may insulate the gate electrode 141 from a first source/drain electrode 151 and a second source/drain electrode 152, which will be described later, in the active area AAR.

The third conductive layer 150 may be disposed on the second insulating layer 161. The third conductive layer 150 is a data conductive layer and may include a data wire for applying a data signal. The third conductive layer 150 may include the first source/drain electrode 151 and the second source/drain electrode 152 of a driving transistor.

The first source/drain electrode 151 may be electrically connected to the first source/drain region 131a of the semiconductor pattern 131a, 131b, and 131c through a contact opening (e.g., a contact hole) penetrating the interlayer insulating pattern 161a and the first insulating layer 113.

The second source/drain electrode 152 may be electrically connected to the second source/drain region 131b of the semiconductor pattern 131a, 131b, and 131c through a contact opening (e.g., a contact hole)penetrating the interlayer insulating pattern 161a and the first insulating layer 113.

The third insulating layer 162 may be disposed on the third conductive layer 150. The third insulating layer 162 may be disposed on the third conductive layer 150 and may completely cover the top surface of the second insulating layer 161. The third insulating layer 162 may include a via layer 162a disposed in the active area AAR. The via layer 162a may completely cover the top surface of the interlayer insulating pattern 161a. The third insulating layer 162 may include an organic insulating material. In an embodiment in which the third insulating layer 162 is an organic layer, the top surface thereof may be partially flat despite a lower (or underlying) step.

The pixel electrode 171 may be disposed on the third insulating layer 162. The pixel electrode 171 may be an anode electrode. The pixel electrode 171 may be disposed to be separated for each pixel. The pixel electrode 171 may be electrically connected to the second source/drain electrode 152 through a contact opening (e.g., a contact hole) penetrating the via layer 162a.

The fourth insulating layer 163 may be disposed on the pixel electrode 171. The fourth insulating layer 163 may include a pixel defining layer 163a disposed in the active area AAR. The pixel defining layer 163a may include an opening partially exposing the pixel electrode 171. The pixel defining layer 163a may partially cover the pixel electrode 171 and the third insulating layer 162. The fourth insulating layer 163 may be formed of an organic insulating material or an inorganic insulating material.

The light emitting layer 172 may be disposed on the pixel electrode 171 exposed by the pixel defining layer 163a. At least a part of the light emitting layer 172 may be disposed in the opening of the fourth insulating layer 163. The light emitting layer 172 may partially cover the top surface of the fourth insulating layer 163 and the side surface of the fourth insulating layer 163 forming the opening.

The light emitting layer 172 may include an organic material layer. The organic material layer may include an organic light emitting layer and may further include a hole injection/transport layer and an electron injection/transport layer.

The common electrode 173 may be disposed on the light emitting layer 172. The common electrode 173 may be extended across all the pixels PX. The common electrode 173 may be a cathode electrode.

The pixel electrode 171, the light emitting layer 172, and the common electrode 173 may constitute a light emitting element EMD. The light emitting element EMD may be, for example, an organic light emitting element.

The thin film encapsulation layer 180 may be disposed above the common electrode 173. The thin film encapsulation layer 180 may include a first inorganic layer 181, a first organic layer 182 disposed on the first inorganic layer 181, and a second inorganic layer 183 disposed on the first organic layer 182. The first inorganic layer 181 and the second inorganic layer 183 may be in contact with each other at the end of the thin film encapsulation layer 180 so that the first organic layer 182 may be sealed by (or sealed between) the first inorganic layer 181 and the second inorganic layer 183.

Each of the first inorganic layer 181 and the second inorganic layer 183 may include silicon nitride, silicon oxide, silicon oxynitride, or the like. The first organic layer 182 may include an organic insulating material.

The display device 1 according to an embodiment may further include the polarization member 200 disposed above the display panel 100. The polarization member 200 may reduce reflection of external light. The polarization member 200 may be provided in the form of a polarizing film. The polarization member 200 may polarize light passing therethrough. The display device 1 according to an embodiment may further include an adhesive layer AL disposed between the display panel 100 and the polarization member 200. The adhesive layer AL may bond the display panel 100 and the polarization member 200 with each other.

Hereinafter, a structure of the hole area HLA in the display device 1 according to an embodiment will be described.

Figure 4:
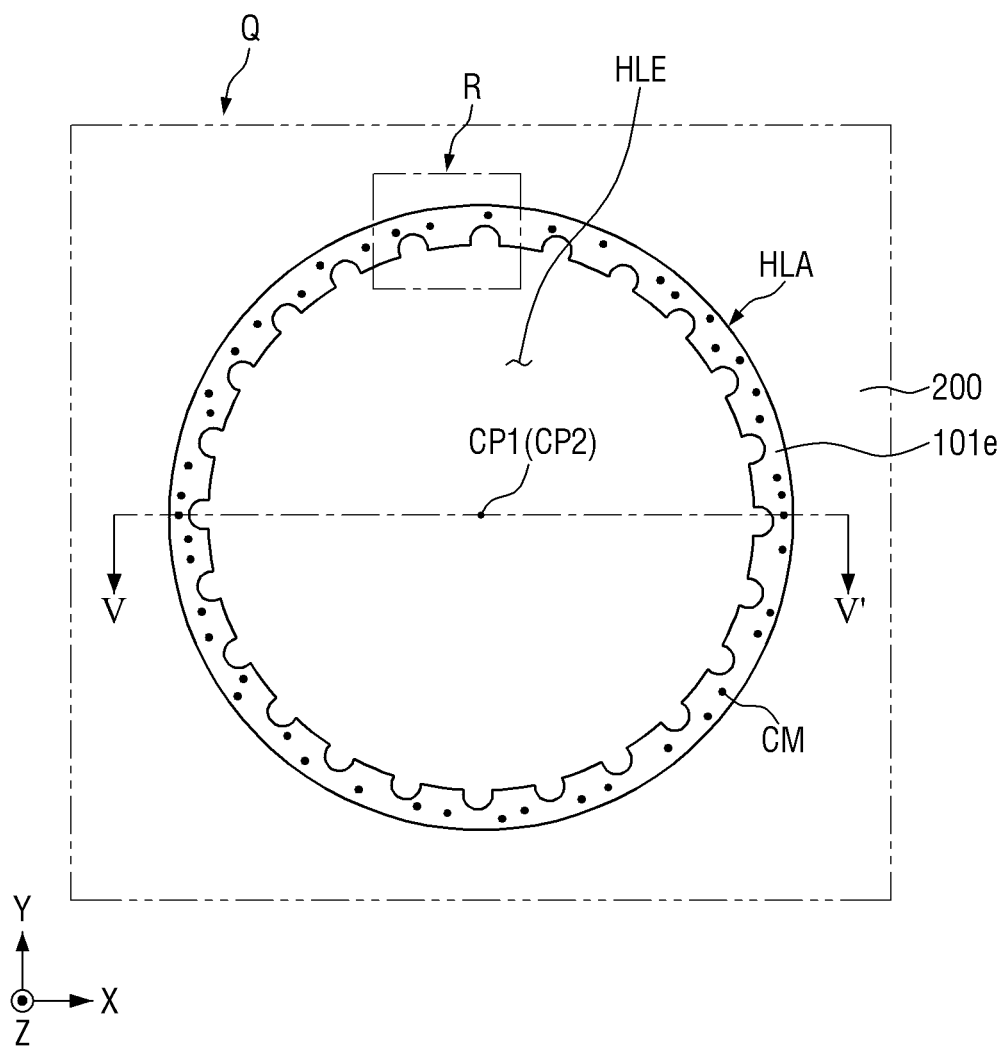
FIG. 4 is an enlarged view of the area Q of FIG. 1.
Figure 5:
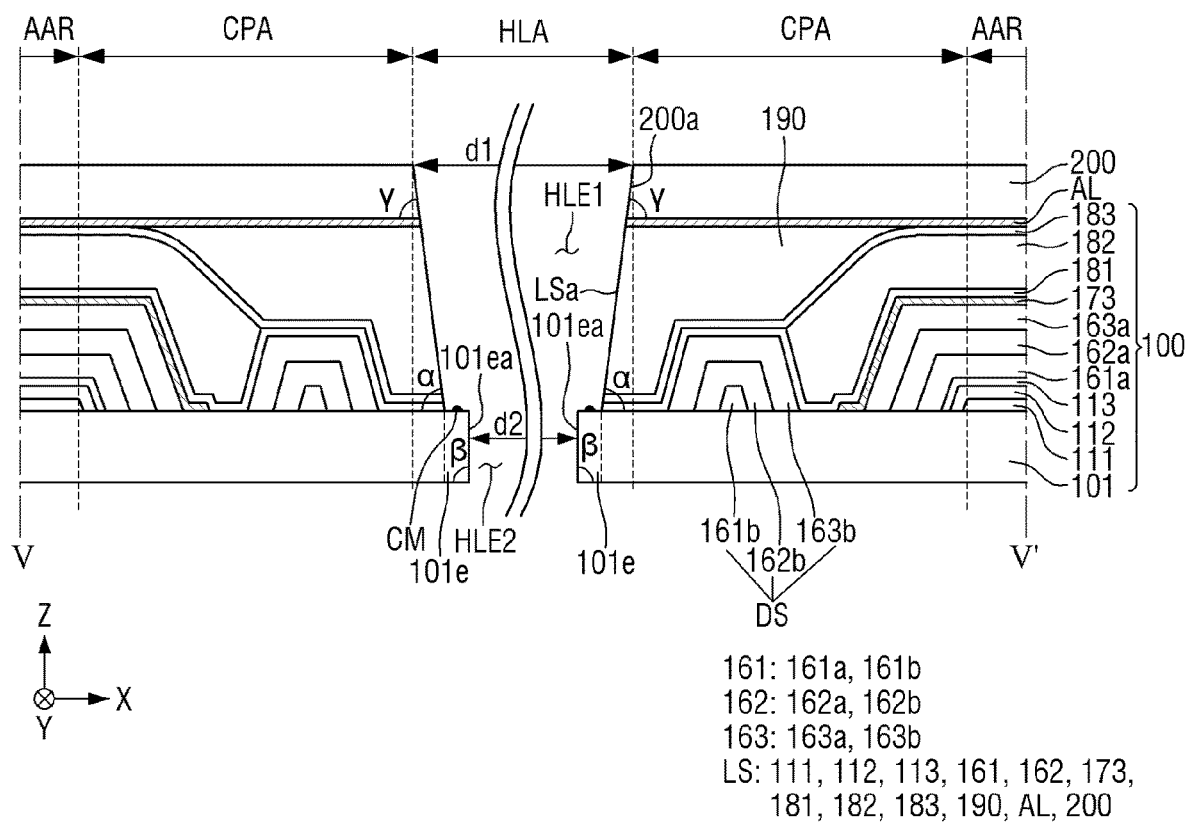
FIG. 5 is a cross-sectional view taken along the line V-V' of FIG. 4.
Figure 6:
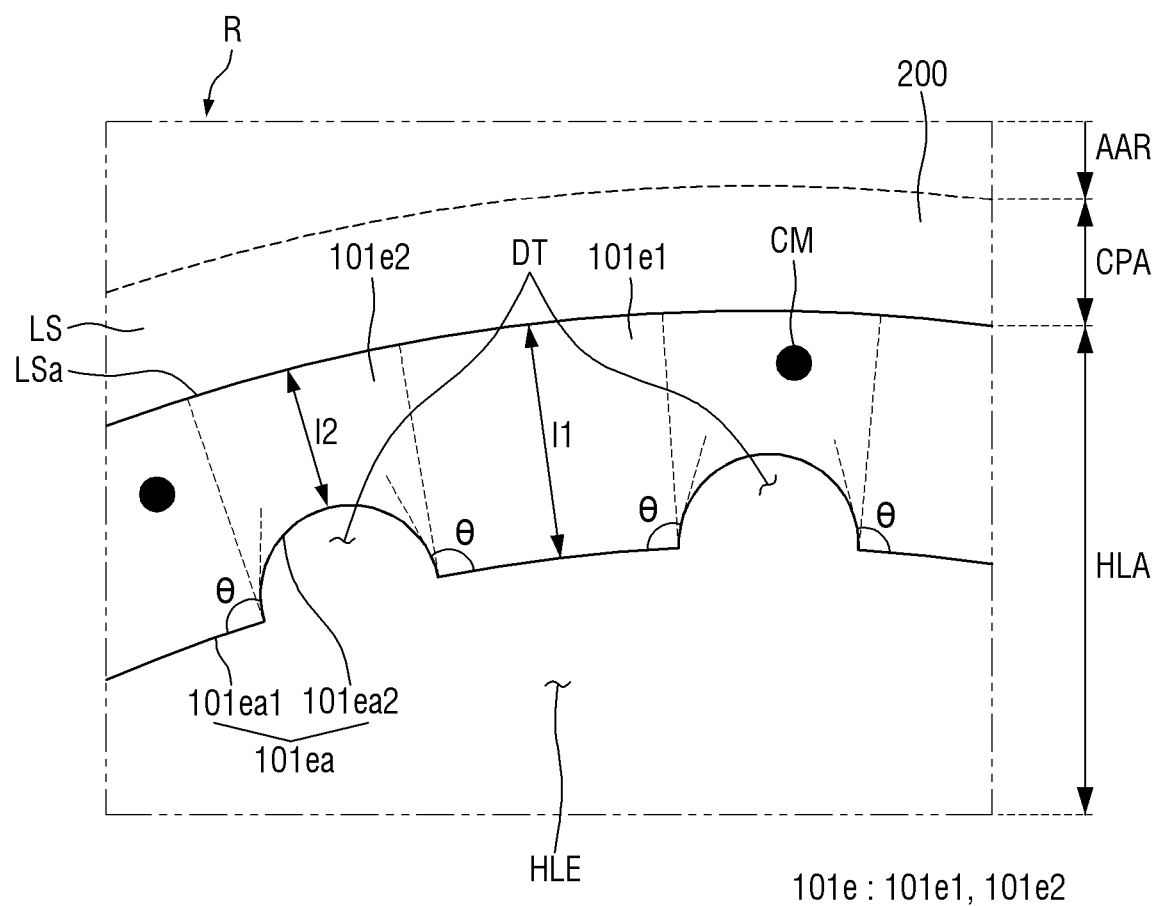
FIG. 6 is an enlarged view of the area R of FIG. 4.

FIG. 4 is an enlarged view of the area Q of FIG. 1, FIG. 5 is a cross-sectional view taken along the line V-V' of FIG. 4, and FIG. 6 is an enlarged view of the area R of FIG. 4.

Referring to FIGS. 4 to 6, the hole area HLA may be in (e.g., may surrounded by) the active area AAR. The hole area HLA may be an area formed by penetrating at least a part of the display device 1 in the thickness direction (e.g., the third direction Z). A plurality of holes (e.g., openings) HLE may be disposed in the hole area HLA. The hole HLE may provide a space in which at least one optical element of a camera, a condensing lens, a light path guide lens, an infrared sensor, an iris recognition sensor, or an illuminance sensor may be disposed. The hole HLE may include a first hole (e.g., a first opening) HLE1 positioned above the base substrate 101 and a second hole (e.g., a second opening) HLE2 penetrating the base substrate 101.

The first hole HLE1 may have a first central point CP1 disposed in the center. For example, the first central point CP1 may be a center (e.g., a center of gravity) in the opened area of the first hole HLE1 in plan view. The second hole HLE2 may include a second central point CP2 disposed in the center. For example, the second central point CP2 may be a center (e.g., a center of gravity) in the opened area of the second hole HLE2 in plan view. The first central point CP1 of the first hole HLE1 and the second central point CP2 of the second hole HLE2 may coincide, but may be different depending on the embodiment.

The first hole HLE1 may have a circular shape in plan view. For example, the edge of the first hole HLE1 may be substantially circular. The edge of the first hole HLE1 may be disposed more outwardly than the edge of the second hole HLE2. The edge of the first hole HLE1 may be disposed on a base substrate exposed portion 101e.

The first hole HLE1 may be surrounded by a stacked structure LS (e.g., the edge of the first hole HLE1 may be formed by the stacked structure LS). The stacked structure LS may include the first inorganic layer 181, the second inorganic layer 183, the polarization member 200, and the adhesive layer AL disposed in an encapsulation area CPA. In addition, the stacked structure LS may further include a planarization layer 190, which will be described later, disposed between the second inorganic layer 183 and the polarization member 200. An inner width d1 of the first hole HLE1 may be defined as a distance between the stacked structures LS opposite each other. The inner width d1 of the first hole HLE1 may increase from the first inorganic layer 181 toward the polarization member 200. For example, the inner width d1 of the first hole HLE1 may increase as it goes away from the base substrate 101. The inner width d1 of the first hole HLE1 may be a length on a plane passing through the central point CP1 of the first hole HLE1 in the opened area of the first hole HLE1.

A side surface LSa of the stacked structure LS may be a surface defining the first hole HLE1. The side surface LSa of the stacked structure LS may be aligned. A first side inclination angle $\alpha$, which is an inclination angle formed by the side surface LSa of the stacked structure LS, may be defined as an angle formed between the side surface LSa of the stacked structure LS and the top surface of the base substrate 101. The first side inclination angle $\alpha$ may be an acute angle.

The second hole HLE2 may have a substantially circular shape in plan view but may include a region partially depressed outwardly. For example, the edge of the second hole HLE2 may be partially depressed outwardly.

The base substrate 101 may include the base substrate exposed portion 101e, which is disposed in the hole area HLA and does not overlap the stacked structure LS. The base substrate exposed portion 101e may be disposed adjacent to the first hole HLE1. The top surface of the base substrate exposed portion 101e may be exposed to the outside. For example, the top surface of the base substrate exposed portion 101e may not be covered by other layers (or members). The top surface of the base substrate exposed portion 101e may be exposed to the first hole HLE1. For example, the first hole HLE1 may be disposed on the base substrate exposed portion 101e.

The base substrate exposed portion 101e may surround (e.g., may extend around or may form) the second hole HLE2. A side surface 101ea of the base substrate exposed portion 101e may be a surface defining the second hole HLE2. The side surface 101ea of the base substrate exposed portion 101e may be partially depressed in the edge direction of the second hole HLE2.

The side surface 101ea of the base substrate exposed portion 101e may include a first side surface 101ea1 parallel to the side surface LSa of the stacked structure LS, and a second side surface 101ea2 extending from the first side surface 101ea1 and depressed toward the active area AAR and the encapsulation area CPA. The first side surface 101ea1 and the second side surface 101ea2 may have a curved shape in plan view. The curvature of the first side surface 101ea1 in plan view may be smaller than the curvature of the second side surface 101ea2 in plan view. In the side surface 101ea of the base substrate exposed portion 101e, the first side surface 101ea1 and the second side surface 101ea2 may be alternately disposed.

The second hole HLE2 may include a depression DT surrounded by (e.g., formed by) the second side surface 101ea2. The depression DT may be a hole (e.g., an opening) penetrating the base substrate exposed portion 101e in the thickness direction. The depression DT may be formed by the base substrate exposed portion 101e being depressed toward the active area AAR and the encapsulation area CPA.

The base substrate exposed portion 101e may include a first base substrate exposed portion 101e1 disposed between the first side surface 101ea1 and the side surface LSa of the stacked structure LS, and a second base substrate exposed portion 101e2 disposed between the second side surface 101ea2 and the side surface LSa of the stacked structure LS. The second base substrate exposed portion 101e2 may be disposed to surround (e.g., to extend around) the depression DT. A width l1 of the first base substrate exposed portion 101e1 may be defined as a distance between the first side surface 101ea1 and the side surface LSa of the stacked structure LS in plan view. A width l2 of the second base substrate exposed portion 101e2 may be defined as a distance between the second side surface 10ea2 and the side surface LSa of the stacked structure LS in plan view.

The width l1 of the first base substrate exposed portion 101e1 may be substantially constant for each area. The width l2 of the second base substrate exposed portion 101e2 may increase and then decrease from the first base substrate exposed portion 101e1 disposed on one side of the second base substrate exposed portion 101e2 toward the first base substrate exposed portion 101e1 disposed on the other side thereof. For example, the width l2 of the second base substrate exposed portion 101e2 may have a minimum value at the central portion of the second base substrate exposed portion 101e2. The width l1 of the first base substrate exposed portion 101e1 may be greater than the width l2 of the second base substrate exposed portion 101e2.

The first side surface 101ea1 and the second side surface 101ea2 extending from the first side surface 101ea1 may form a dihedral angle $\theta$ therebetween. In an embodiment, the dihedral angle $\theta$ may be an obtuse angle, but it is not limited thereto.

The second hole HLE2 may be surrounded by (e.g., formed by) the base substrate exposed portion 101e. An inner width d2 of the second hole HLE2 may be defined as a distance between the base substrate exposed portions 101e opposite each other. In addition, the inner width d2 of the second hole HLE2 may be a length on a plane passing through the central point CP2 of the second hole HLE2 in the opened area of the second hole HLE2. The inner width d2 of the second hole HLE2 may be smaller than the inner width d1 of the first hole HLE1.

The inner width of the second hole HLE2 may be substantially constant in the thickness direction.

A second side inclination angle $\beta$, which is an inclination angle formed by the side surface 101ea of the base substrate exposed portion 101e, may be defined as an angle formed between the side surface 101ea of the base substrate exposed portion 101e and the bottom surface of the base substrate exposed portion 101e. The bottom surface of the base substrate exposed portion 101e may be a surface opposite to the surface on which the stacked structure LS is located in the base substrate exposed portion 101e. The second side inclination angle $\beta$ may be greater than the first side inclination angle $\alpha$. For example, the second side inclination angle $\beta$ may be about 90°, but it is not limited thereto and may be an acute angle or an obtuse angle.

In the stacked structure LS, a side surface 200a of the polarization member 200 may be a surface surrounding (e.g., extending around) the first hole HLE1. The side surface 200a of the polarization member 200 may be a part of the side surface LSa of the stacked structure LS. A third side inclination angle $\gamma$, which is an inclination angle formed by the side surface 200a of the polarization member 200, may be defined as an angle formed between the side surface 200a of the polarization member 200 and the bottom surface of the polarization member 200 in contact with the adhesive layer AL. The third side inclination angle γ may be an acute angle. The third side inclination angle γ may be substantially the same as the above-described first side inclination angle α, but it is not limited thereto.

The display device 1 according to an embodiment may further include the encapsulation area CPA disposed between the hole area HLA and the active area AAR. The encapsulation area CPA is an area in which various insulating layers of the active area AAR are encapsulated, and a dam structure DS may be disposed in the encapsulation area CPA. Due to the dam structure DS, the first organic layer 182 may not overflow toward the hole area HLA. The dam structure DS may include a first structure 161b included in the second insulating layer 161, a second structure 162b included in the third insulating layer 162, and a third structure 163b included in the fourth insulating layer 163. The first structure 161b may be disposed on the same layer as the interlayer insulating pattern 161a, the second structure 162b may be disposed on the same layer as the via layer 162a, and the third structure 163b may be disposed on the same layer as the pixel defining layer 163a.

The first inorganic layer 181 may be disposed on the dam structure DS, and the first inorganic layer 181 may cover the dam structure DS. The second inorganic layer 183 may be further disposed on the dam structure DS. The first inorganic layer 181 and the second inorganic layer 183 may contact each other in at least a part of the dam structure DS. For example, the first inorganic layer 181 and the second inorganic layer 183 may contact each other on the top surface of the dam structure DS and the side surface of the dam structure DS adjacent to the hole area HLA. The first organic layer 182 may be disposed on the first inorganic layer 181 disposed on the side surface of the dam structure DS adjacent to the active area AAR. Here, the first organic layer 182 may be disposed between the first inorganic layer 181 and the second inorganic layer 183.

In the display device 1 according to an embodiment, the barrier layer 111, the buffer layer 112, the interlayer insulating pattern 161a, the via layer 162a, the pixel defining layer 163a, and the common electrode 173 may extend from the active area AAR and may be partially disposed in the encapsulation area CPA.

In the encapsulation area CPA, the buffer layer 112 may cover the edge of the barrier layer 111 extending from the active area AAR, the first insulating layer 113 may cover the edge of the buffer layer 112 extending from the active area AAR, the interlayer insulating pattern 161a may cover the edge of the first insulating layer 113 extending from the active area AAR, the via layer 162a may cover the interlayer insulating pattern 161a extending from the active area AAR, the pixel defining layer 163a may cover the via layer 162a extending from the active area AAR, the common electrode 173 may cover the pixel defining layer 163a extending from the active area AAR, and the first inorganic layer 181 may cover the common electrode 173 extending from the active area AAR.

The display device 1 according to an embodiment may further include the planarization layer 190 disposed between the second inorganic layer 183 and the polarization member 200 in the encapsulation area CPA. The planarization layer 190 may have a flat top surface despite a stepped portion of the second inorganic layer 183 disposed therebelow in the encapsulation area CPA. The planarization layer 190 may include (or may be made of) an organic material.

A plurality of carbides CM may be disposed on the base substrate exposed portion 101e. The carbide CM may be formed by carbonizing a part of the stacked structure LS on the base substrate 101 in the display panel 100 in a laser irradiation process, to be described later. For example, the carbide CM may be formed by partially carbonizing at least one of the planarization layer 190, the adhesive layer AL, or the polarization member 200. Accordingly, the carbide CM may include a material in which at least one of a material included in the planarization layer 190, a material included in the adhesive layer AL, or a material included in the polarization member 200 is carbonized.

The display device 1 according to an embodiment may have the first hole HLE1 surrounded by (e.g., formed or defined by) the stacked structure LS of which the side surface LSa produced by multiple laser processing processes has the first side inclination angle α, and the base substrate exposed portion 101e of which the side surface 101ea has the second side inclination angle β greater than the first side inclination angle α, thereby reducing or minimizing the encapsulation area CPA, increasing or maximizing the size of the active area AAR for displaying an image. The laser processing process for manufacturing the display device 1 according to an embodiment will be described later.

Figure 7:
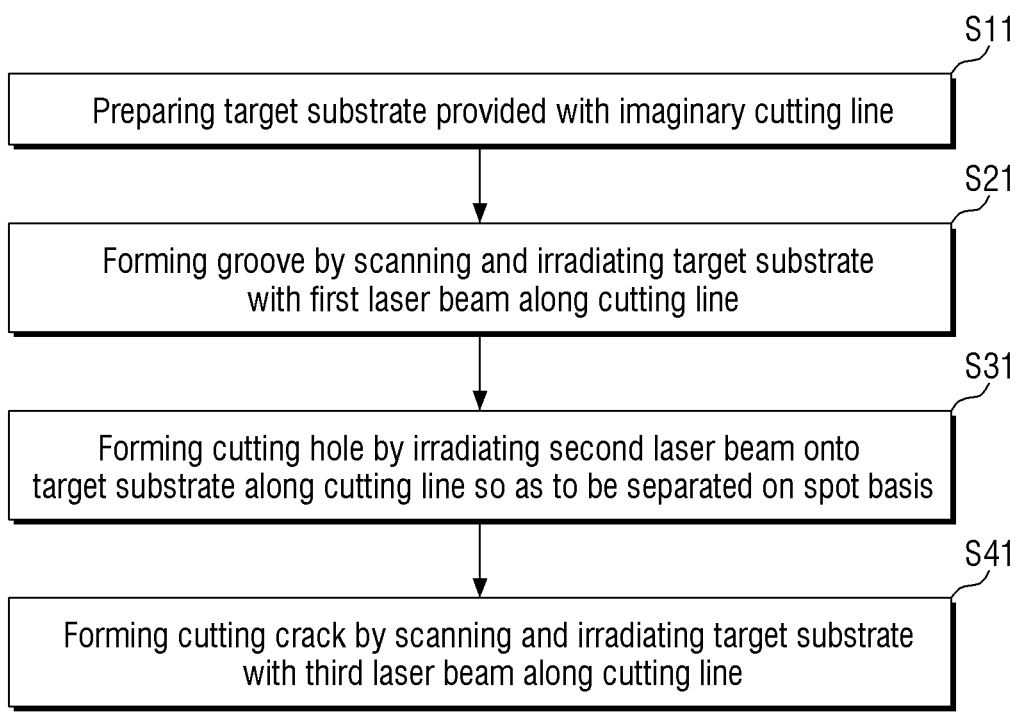
FIG. 7 is a flowchart of a method for manufacturing a display device according to an embodiment.

FIG. 7 is a flowchart of a method for manufacturing a display device according to an embodiment.

Referring to FIG. 7, a method for manufacturing the display device according to an embodiment may include multiple laser processing processes. A method for manufacturing the display device according to an embodiment may include preparing a target substrate provided with an imaginary cutting line (step S11), forming a groove by irradiating a first laser beam along the cutting line while scanning the target substrate (step S21), forming a cutting hole by irradiating a second laser beam to the target substrate along the cutting line so as to be separated on a spot basis (step S31), and forming a cutting crack by irradiating a third laser beam along the cutting line while scanning the target substrate (step S41).

Hereinafter, step S21 of forming a groove by irradiating a first laser beam along the cutting line while scanning the target substrate will be described with reference to FIGS. 8 to 14, step S31 of forming a cutting hole by irradiating a second laser beam to the target substrate along the cutting line so as to be separated on a spot basis will be described with reference to FIGS. 15 to 18, and step S41 of forming a cutting crack by irradiating a third laser beam along the cutting line while scanning the target substrate will be described with reference to FIGS. 19 to 21.

Figure 8:
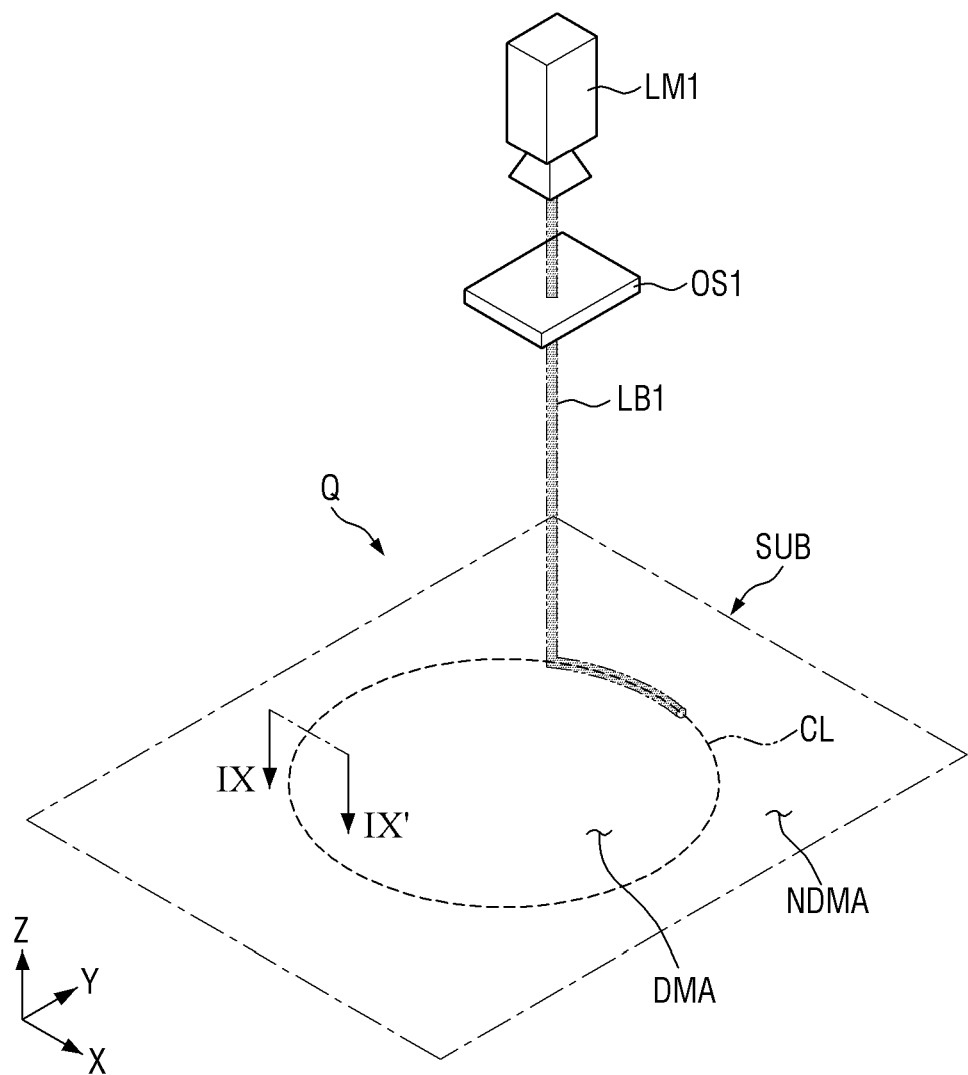
FIG. 8 is a schematic diagram showing a first laser processing step.
Figure 9:
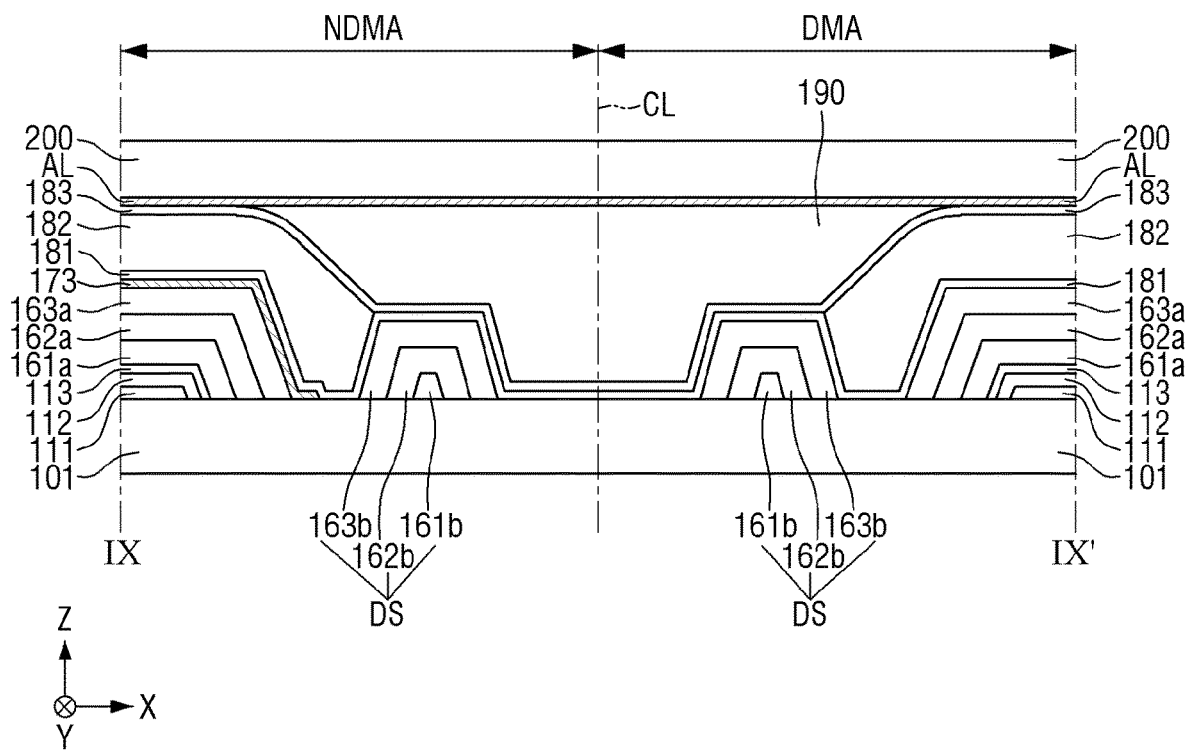
FIG. 9 is a cross-sectional view taken along the line IX-IX' of FIG. 8.
Figure 10:
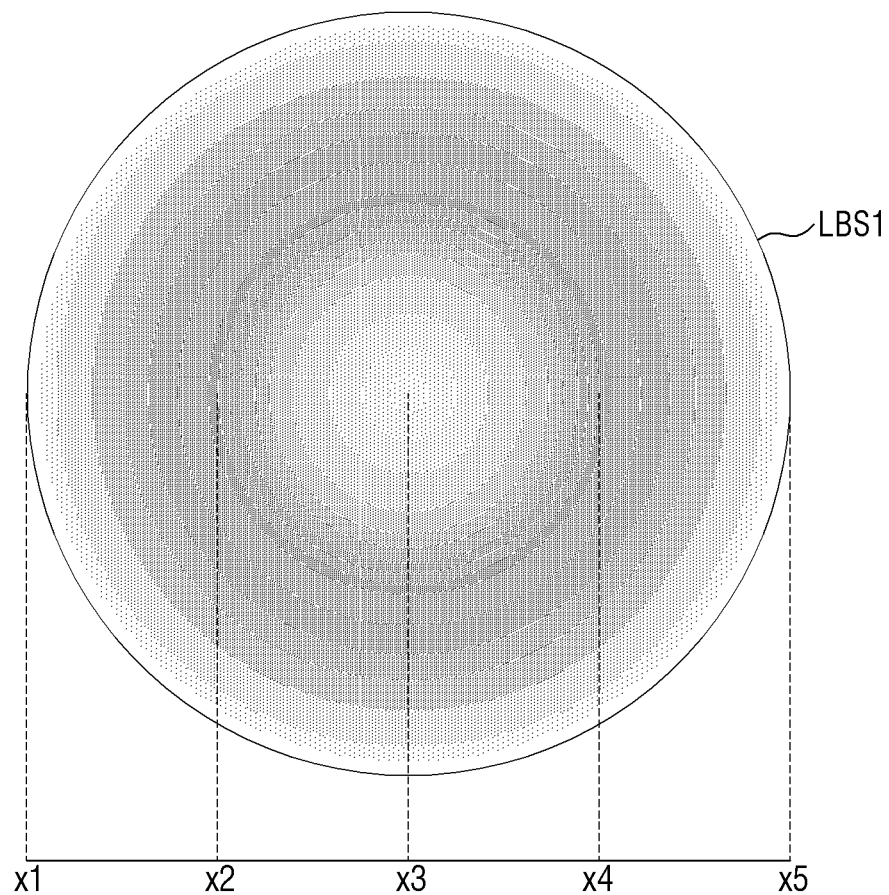
FIG. 10 is a schematic diagram showing a spot of a first laser beam.
Figure 11:
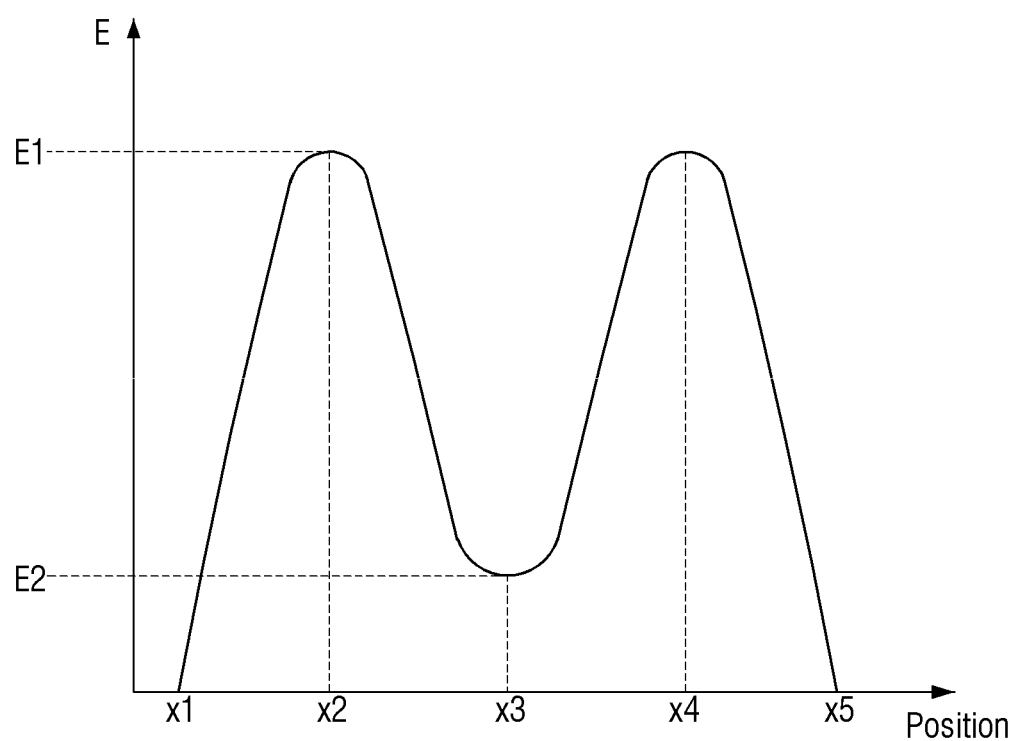
FIG. 11 is a graph showing an energy profile of the spot of the first laser beam shown in FIG. 10.
Figure 12:
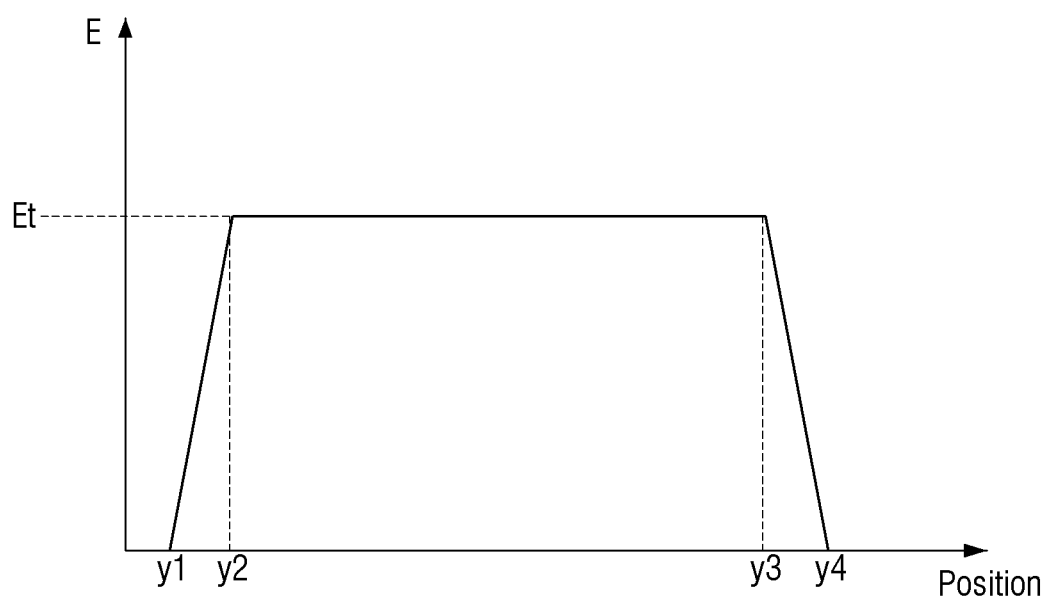
FIG. 12 is a graph showing an energy profile of a target substrate when a first laser beam is irradiated while scanning the target substrate.
Figure 13:
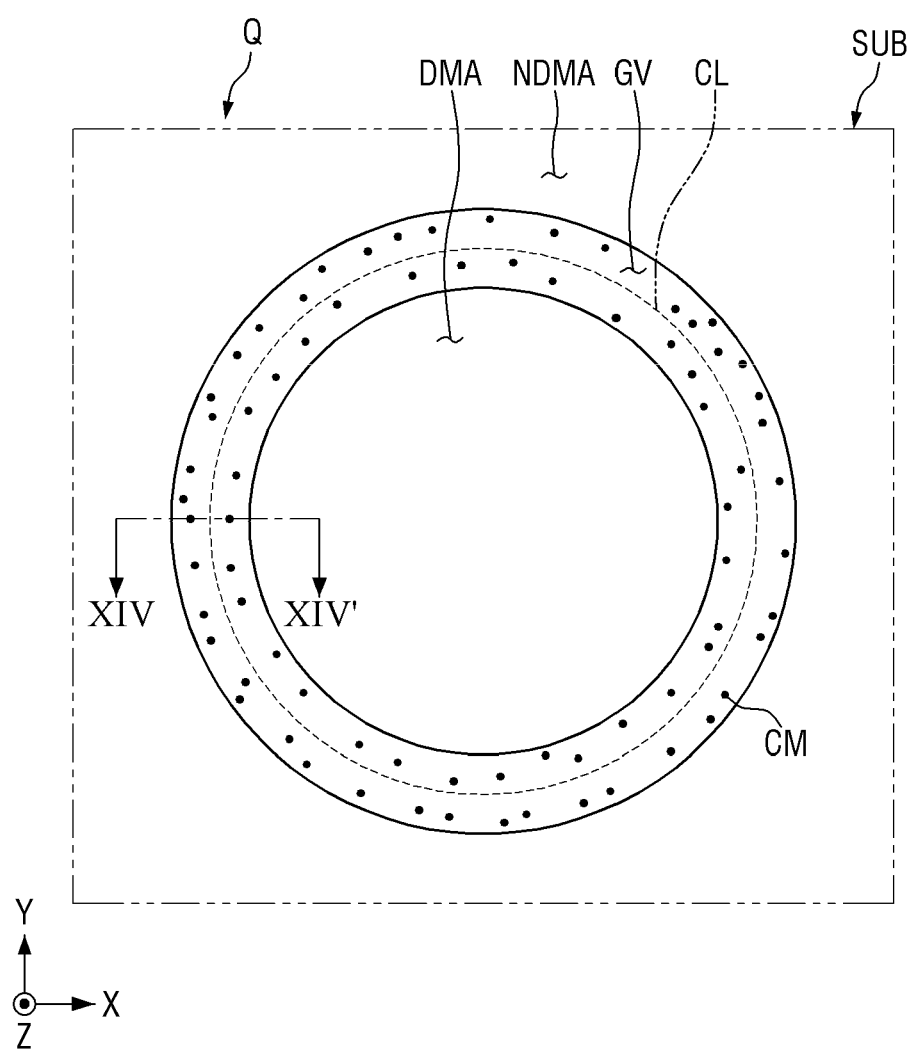
FIG. 13 is a plan view showing a target substrate after a first laser processing step.
Figure 14:
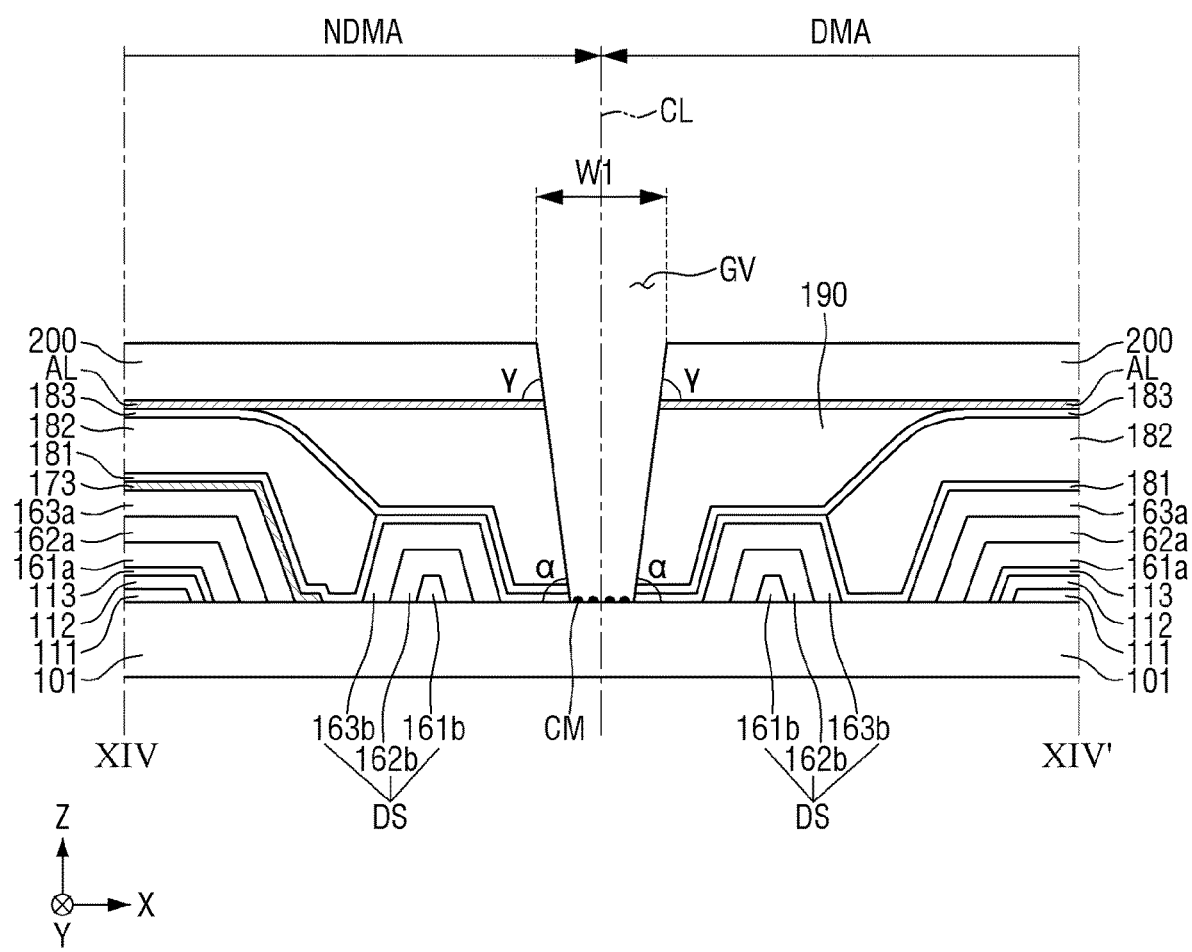
FIG. 14 is a cross-sectional view taken along the line XIV-XIV' of FIG. 13.

FIG. 8 is a schematic diagram showing a first laser processing step. FIG. 9 is a cross-sectional view taken along the line IX-IX' of FIG. 8. FIG. 10 is a schematic diagram showing a spot of a first laser beam. FIG. 11 is a graph showing an energy profile of the spot of the first laser beam shown in FIG. 10. FIG. 12 is a graph showing an energy profile of a target substrate when a first laser beam is irradiated while scanning the target substrate. FIG. 13 is a plan view showing a target substrate after a first laser processing step. FIG. 14 is a cross-sectional view taken along the line XIV-XIV' of FIG. 13.

Referring to FIGS. 8 to 14, first, in the method for manufacturing the display device according to an embodiment, step S11 of preparing a target substrate provided with an imaginary cutting line may be performed. In step S11, a target substrate SUB may be in a state during the manufacturing process of the display device 1 described above with reference to FIGS. 3 to 6. For example, the target substrate SUB may include the display panel 100 in a state before the hole HLE is formed, and the polarization member 200 which is disposed above the display panel 100 and is in a state before the hole HLE is formed. For example, the target substrate SUB may include the base substrate 101 and the stacked structure LS disposed on the base substrate 101.

An imaginary cutting line CL may be formed on the target substrate SUB. The cutting line CL is an imaginary line on which a laser irradiation process is performed and may be a line arbitrarily designated by a user. The cutting line CL on the target substrate SUB may substantially coincide with the edge of the hole area HLA. An inner side of the target substrate SUB with respect to the cutting line CL may be a dummy area DMA partially removed through a later process, and an outer side thereof may be a remaining area NDMA. The dummy area DMA may be removed through a later process so that a position where the dummy area DMA was located in the target substrate SUB may become a part of the hole area HLA. The remaining area NMDA may include the encapsulation area CPA and the active area AAR of the display device 1 manufactured through a later process. In addition, the remaining area NMDA may further include a part of the edge of the hole area HLA.

The base substrate 101, the barrier layer 111 disposed on the base substrate 101, the buffer layer 112 disposed on the barrier layer 111, the interlayer insulating pattern 161a disposed on the buffer layer 112, the via layer 162a disposed on the interlayer insulating pattern 161a, the pixel defining layer disposed on the via layer 162a, the first inorganic layer 181 disposed on the pixel defining layer 163a, the first organic layer 182 disposed on the first inorganic layer 181, the second inorganic layer 183 disposed on the first organic layer 182, the adhesive layer AL disposed on the second inorganic layer 183, and the polarization member 200 disposed on the adhesive layer AL may be disposed in the dummy area DMA of the target substrate SUB. In addition, the dam structure DS may be disposed along the edge of the dummy area DMA. The dam structure DS in the dummy area DMA may include the first structure 161b included in the second insulating layer 161, the second structure 162b included in the third insulating layer 162, and the third structure 163b included in the fourth insulating layer 163. The dam structure DS in the dummy area DMA may have substantially the same structure as the dam structure DS in the encapsulation area CPA described above. For example, the dummy area DMA may have the same structure as the encapsulation area CPA described above except that the common electrode 173 is not included.

After step S11 of preparing a target substrate provided with an imaginary cutting line, step S21 of forming a groove by irradiating a first laser beam along the cutting line while scanning the target substrate may be performed. First, a first laser beam LB1 used in this step will be described.

The first laser beam LB1 may be emitted from a first laser module LM1 and irradiated onto the cutting line CL of the target substrate SUB through a first optical system OS1. The first laser beam LB1 may be configured to provide uniform energy to the target substrate SUB for each region in a direction perpendicular to the extension direction of the cutting line CL. The stacked structure LS is partially removed from the target substrate SUB by the first laser beam LB1, and the base substrate 101 in a region where the stacked structure LS has been removed may be exposed. A groove GV may be formed in the region where the stacked structure LS has been partially removed.

The first laser module LM1 may use a $CO_2$ laser, but it is not limited thereto. The first laser beam LB1 outputted from the first laser module LM1 may enter the first optical system OS1. The first optical system OS1 may control the optical path and energy profile of the first laser beam LB1 provided from the first laser module LM1 and may emit the first laser beam LB1 toward an irradiation target. The first optical system OS1 is a beam shaper that controls the energy profile of a beam spot LBS1 and may include at least one optical element. For example, the first optical system OS1 may include at least one of a convex lens, a concave lens, a convex mirror, and a concave mirror, or a lens or a mirror formed of a combination thereof. For example, the first optical system OS1 may include a composite lens in which a convex lens and a concave lens are combined in one lens.

The first laser module LM1 may emit a Gaussian distribution laser having relatively high energy in the central portion, but the laser may be changed into the first laser beam LB1 in which the energy profile of the beam spot LBS1 is controlled through the first optical system OS1.

The beam spot LBS1 of the first laser beam LB1 that has passed through the first optical system OS1 may be formed as illustrated in FIG. 10. In FIG. 10, first to fifth positions $x1$, $x2$, $x3$, $x4$, and $x5$ are shown on an imaginary line passing through the center of the beam spot LBS1 of the first laser beam LB1. The first and fifth positions $x1$ and $x5$ are located at the edges in one side and the other side of the imaginary line, and the third position $x3$ is located at the center of the beam spot LBS1 of the first laser beam LB1, the second position $x2$ is located between the first position $x1$ and the third position $x3$, and the fourth position $x4$ is located between the third position $x3$ and the fifth position $x5$.

Referring to FIG. 11, looking at the energy profile for each position on the imaginary line in the beam spot LBS1 of the first laser beam LB1, the energy profile of the beam spot LBS1 of the first laser beam LB1 may have an M-shaped energy profile in which the energy increases and then decreases from the edge toward the center. Here, the M-shaped energy profile may be an energy profile having second energy E2 at the third position $x3$ of the beam spot LBS1 and having first energy E1 greater than the second energy E2 at the second and fourth positions $x2$ and $x4$. The beam spot LBS1 of the first laser beam LB1 may have reduced or minimum (e.g., local minimum) energy at the third position $x3$, which is the center of the beam spot LBS1.

However, the present disclosure is not limited thereto, and the beam spot LBS1 of the first laser beam LB1 may have a vortex energy profile. The vortex energy profile refers to an energy profile in which the second energy E2, which is energy at the third position $x3$, i.e., the center of the beam spot LBS1, is zero.

Referring to FIG. 12, when the first laser beam LB1 is irradiated along the cutting line CL of the target substrate SUB while scanning it, the beam spot LBS1 of the first laser beam LB1 may move along the cutting line CL while overlapping therewith to provide energy to the target substrate SUB. A cumulative energy profile that is created when the beam spot LBS1 moves along the cutting line CL while overlapping therewith may be shown as in the graph of FIG. 12. For example, when the beam spot LBS1 having the energy profile shown in FIG. 11 moves along the cutting line CL while overlapping therewith, the cumulative energy profile as shown in the graph of FIG. 12 may be created.

The cumulative energy profile of FIG. 12 may be an energy profile obtained by cutting the cutting line CL in a direction perpendicular to the moving direction of the first laser beam LB1. In the cumulative energy profile of the first laser beam LB1, the energy may increase from the edge position in a direction perpendicular to a laser movement direction LDR toward the center, and then have substantially constant cumulative energy Et.

For example, the energy may be zero at a first movement vertical position y1 and a fourth movement vertical position y4 positioned at the edges on one side and the other side in a direction perpendicular to the moving direction of the first laser beam LB1. When moving from the first movement vertical position y1 toward the fourth movement vertical position y4, the energy rapidly increases, so that the constant cumulative energy Et may be obtained at the second movement vertical position y2. In addition, when moving from the fourth movement vertical position y4 toward the first movement vertical position y1 by a distance (e.g., a predetermined distance), the energy rapidly increases, so that the constant cumulative energy Et may be obtained at the third movement vertical position y3.

In the target substrate SUB after step S21 of forming a groove by irradiating a first laser beam along the cutting line while scanning the target substrate is performed, the stacked structure LS on the base substrate 101 may be partially removed to form the groove GV along the cutting line CL. The groove GV has a width (e.g., a predetermined width) in a direction perpendicular to the extension direction of the cutting line CL and may be formed along the extension direction of the cutting line CL. The groove GV may expose at least a part of the top surface of the base substrate 101. The carbide CM may be disposed on the base substrate 101 exposed by the groove GV. That is, the carbide CM may be formed through a process of irradiating the first laser beam LB1 and may be formed by carbonizing at least one of the materials constituting the stacked structure LS. The groove GV may have a first width W1 in a direction perpendicular to the extension direction of the cutting line CL. The first width W1 may decrease toward the base substrate 101 in the thickness direction.

Figure 15:
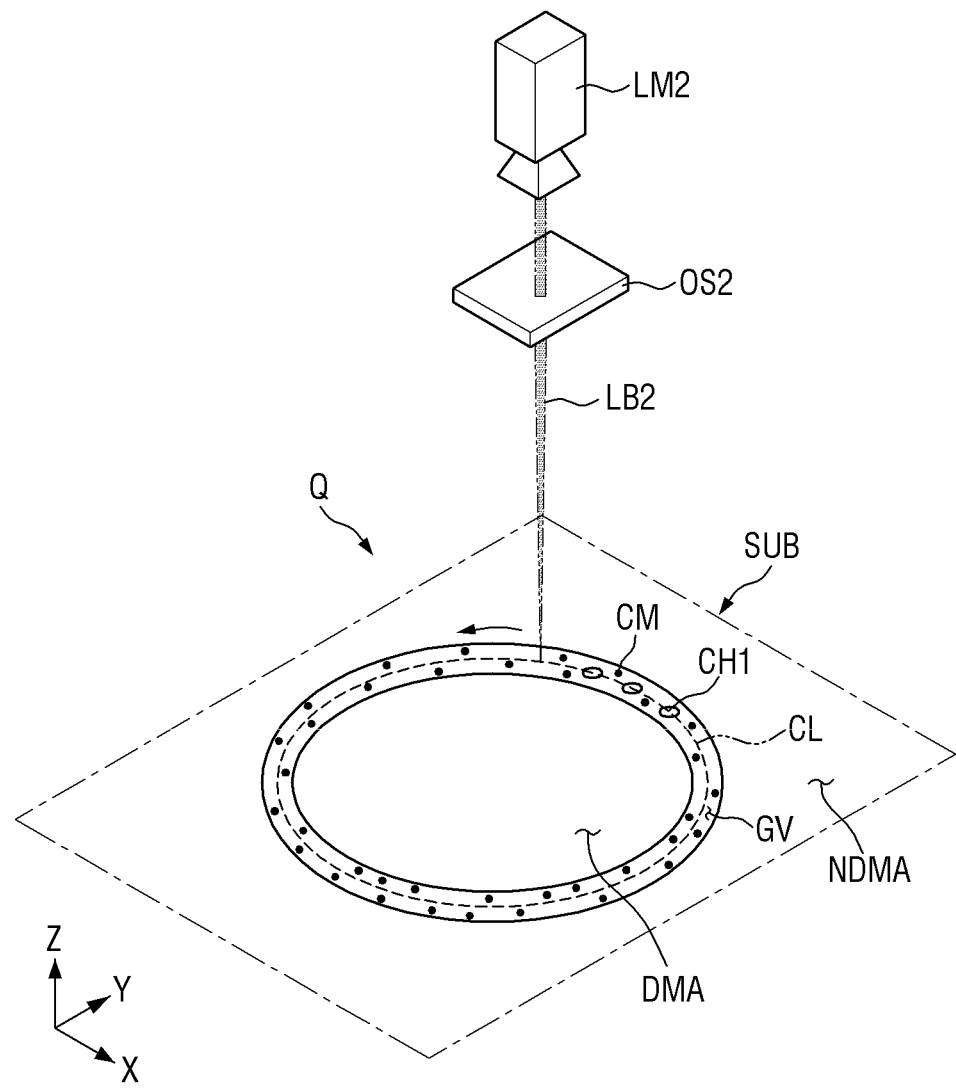
FIG. 15 is a schematic diagram showing a second laser processing step.
Figure 16:
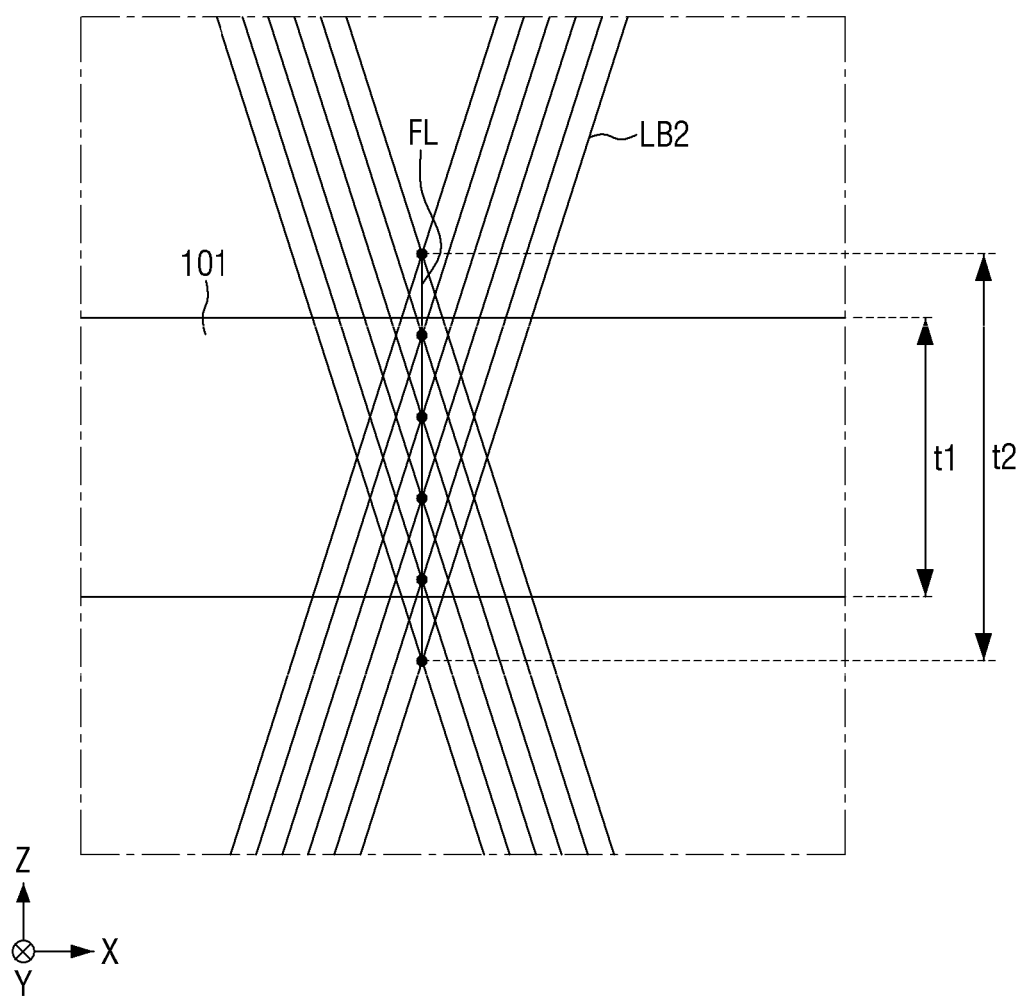
FIG. 16 is a schematic diagram showing a process in which a second laser beam passes through a base substrate.
Figure 17:
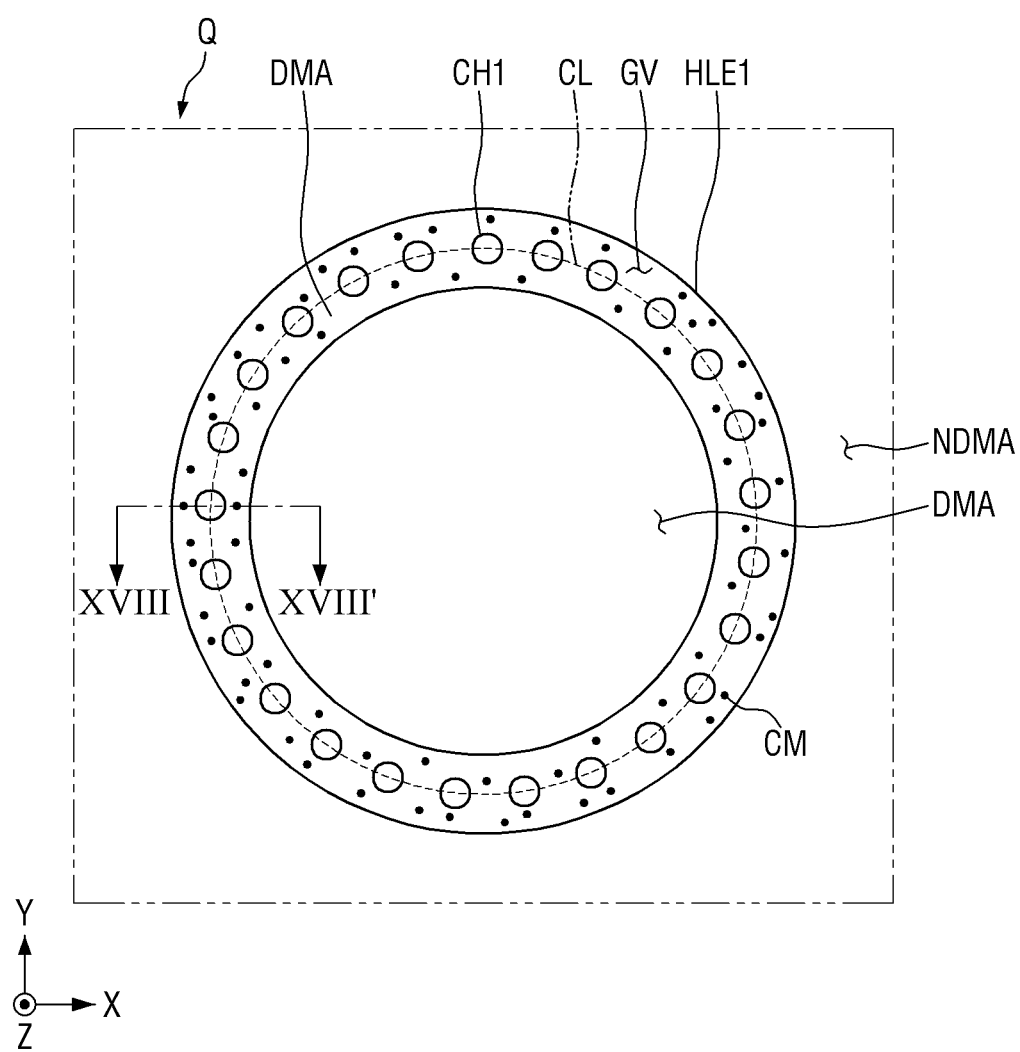
FIG. 17 is a plan view showing a target substrate after a second laser processing step.
Figure 18:
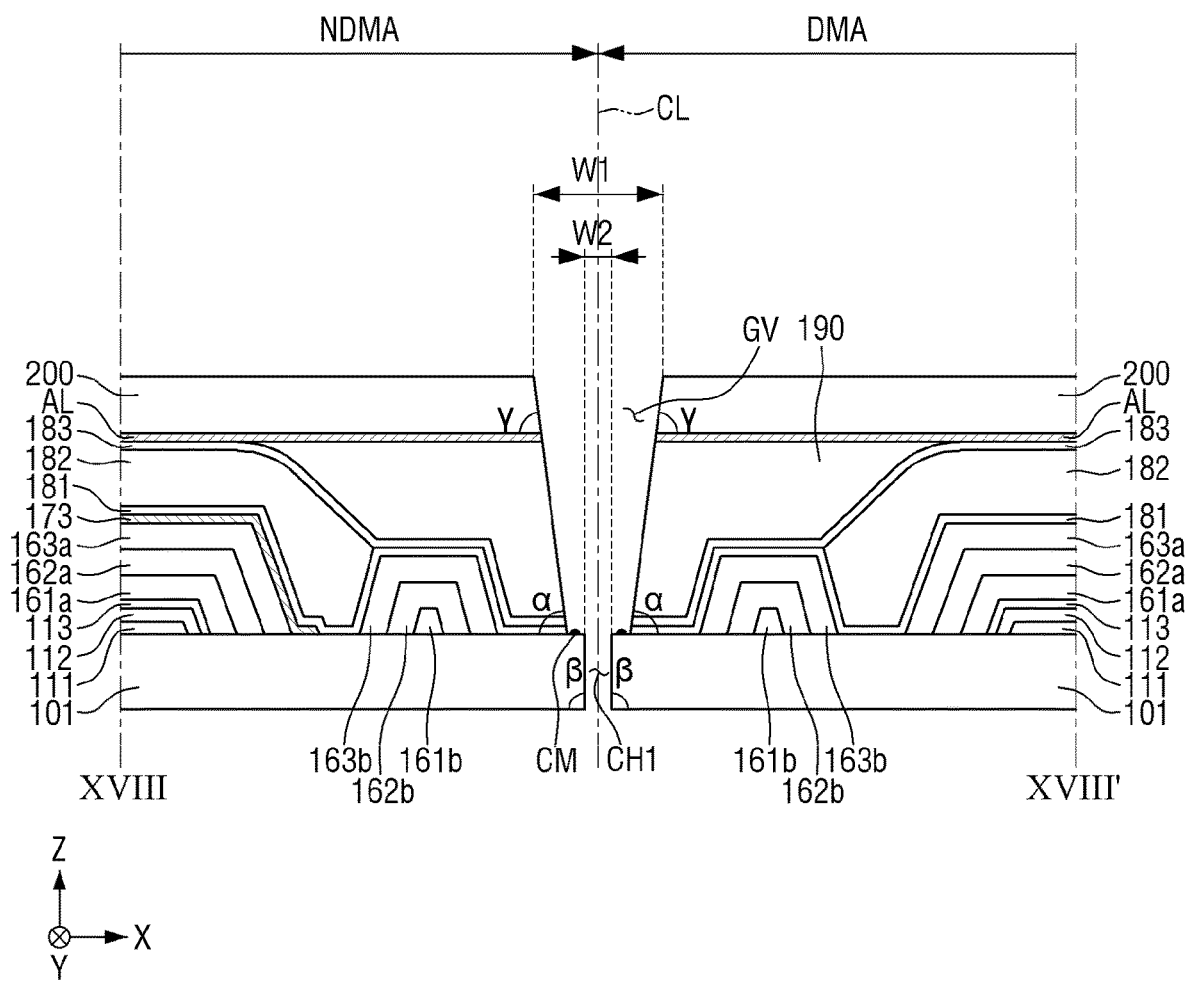
FIG. 18 is a cross-sectional view taken along the line XVIII-XVIII' of FIG. 17.

FIG. 15 is a schematic diagram showing a second laser processing step. FIG. 16 is a schematic diagram showing a process in which a second laser beam passes through a base substrate. FIG. 17 is a plan view showing a target substrate after a second laser processing step. FIG. 18 is a cross-sectional view taken along the line XVIII-XVIII' of FIG. 17.

Referring to FIGS. 15 to 18, after step S21 of forming a groove by irradiating a first laser beam along the cutting line while scanning the target substrate, step S31 of forming a cutting hole by irradiating a second laser beam to the target substrate along the cutting line so as to be separated on a spot basis may be performed.

In step S31, a second laser beam LB2 may be a filamentation beam or a Bessel beam. In addition, the wavelength of the second laser beam LB2 may have a wavelength band in the infrared region. For example, the wavelength of the second laser beam LB2 may be in a range of about 0.72 μm to about 300 μm, but it is not limited thereto. The second laser beam LB2 may be emitted from a second laser module LM2 and irradiated onto the cutting line CL of the target substrate SUB through a second optical system OS2. The second laser beam LB2 may be irradiated onto the base substrate 101 exposed by the groove GV. As a result, a cutting hole (e.g., a cutting opening) CH1 penetrating the base substrate 101 in the thickness direction (e.g., the third direction Z) may be formed in an area irradiated with the second laser beam LB2.

The second laser module LM2 may be an infrared laser module that emits a laser in an infrared wavelength band. The second optical system OS2 may include an Axicon lens.

Through this, the second laser beam LB2 that has passed through the second optical system OS2 may be changed into a filamentation beam or a Bessel beam. The second laser beam LB2 may be irradiated so as to be separated on a spot basis.

A focal point of the second laser beam LB2 may be formed in the form of a focal line FL having a length (e.g., a predetermined length). As shown in FIG. 16, a length t2 of the focal line FL of the second laser beam LB2 may be greater than a thickness t1 of the base substrate 101. The focal line FL of the second laser beam LB2 may be disposed to entirely cover the base substrate 101 in the thickness direction. In this case, a plurality of cutting holes (e.g., cutting openings) CH1 penetrating the base substrate 101 in the thickness direction may be formed in the base substrate 101 by the second laser beam LB2. The planar shape of each cutting hole CH1 may be circular. The cutting holes CH1 may be formed to be spaced apart along the cutting line CL.

A width W2 of each cutting hole CH1 may be substantially constant in the thickness direction of the base substrate 101 but is not limited thereto. The width W2 of each cutting hole CH1 may be the diameter of the cutting hole CH1.

In the process of forming the plurality of cutting holes CH1 by using the second laser beam LB2, a fine crack may be formed around each cutting hole CH1. A third laser beam LB3, to be described later, may propagate the fine crack to form a cutting crack CH2 connecting the plurality of cutting holes CH1 to each other.

Figure 19:
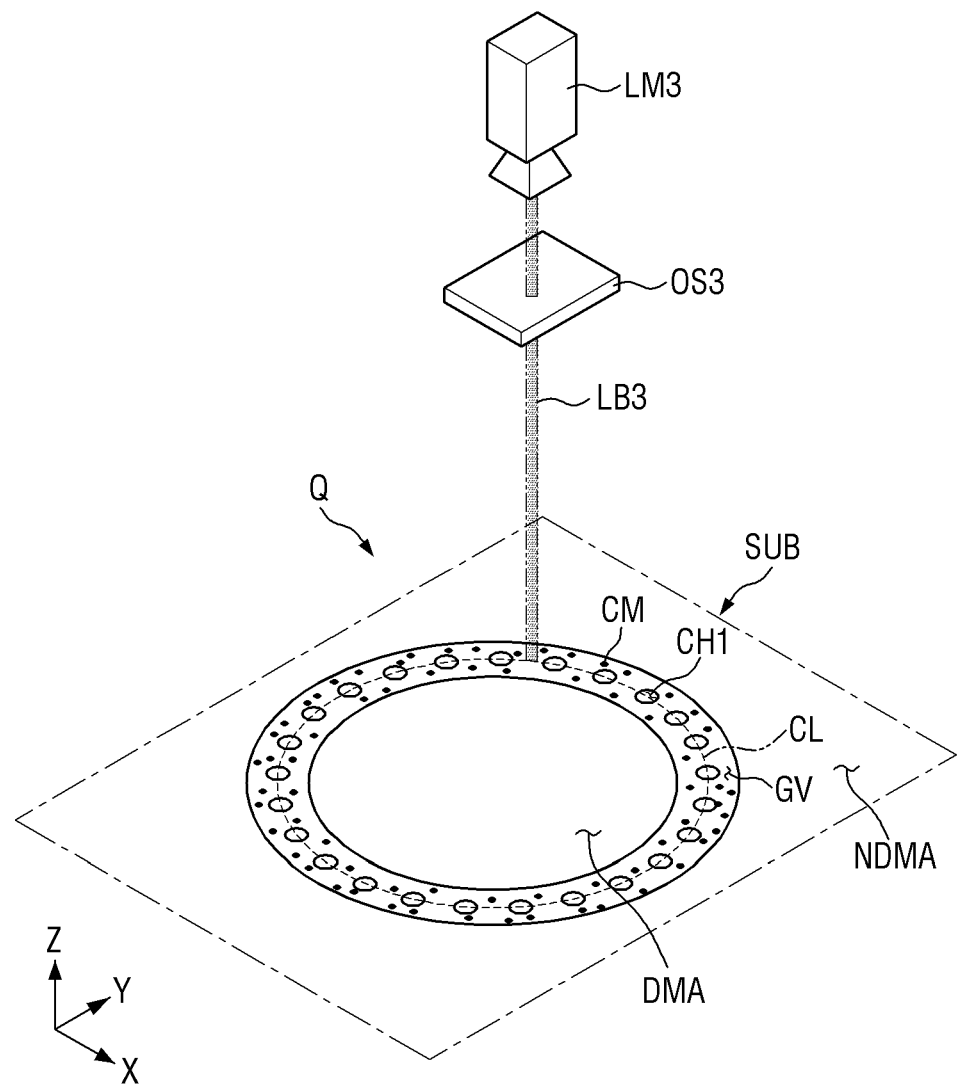
FIG. 19 is a schematic diagram showing a third laser processing step.

FIG. 19 is a schematic diagram showing a third laser processing step. FIG. 20 is a plan view showing the target substrate after the third laser processing step. FIG. 21 is a cross-sectional view taken along the line XXI-XXI' of FIG. 20.

Figure 20:
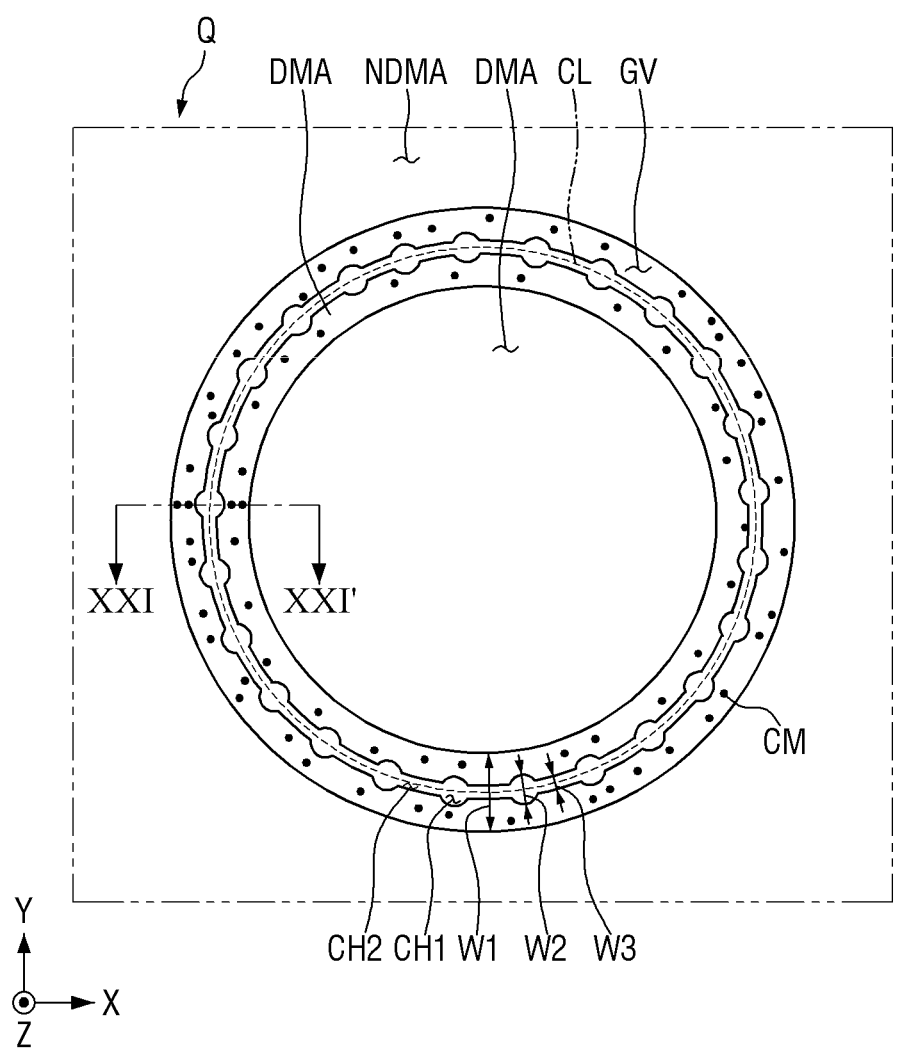
FIG. 20 is a plan view showing the target substrate after the third laser processing step.
Figure 21:
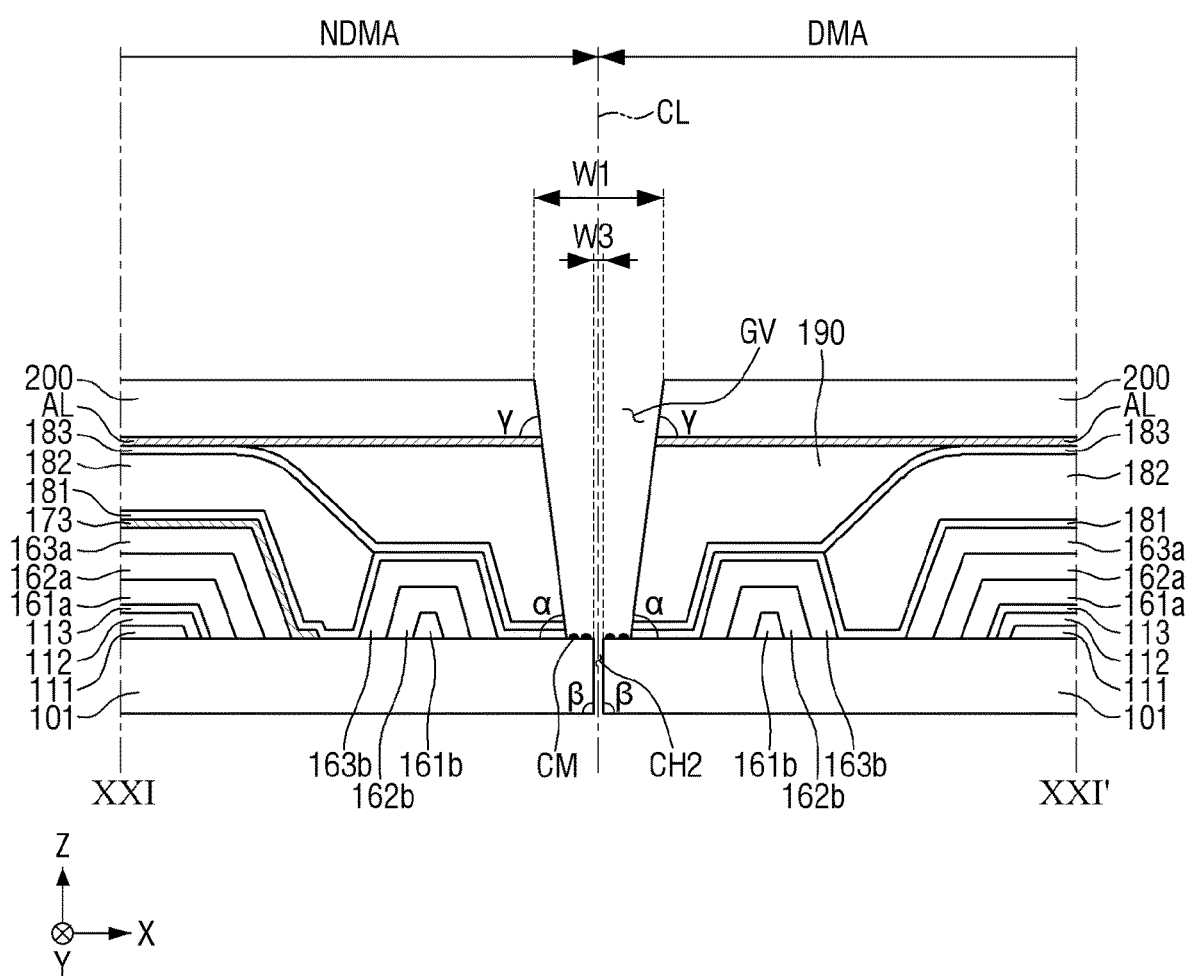
FIG. 21 is a cross-sectional view taken along the line XXI-XXI' of FIG. 20.

Referring to FIGS. 19 to 21, step S31 of forming a cutting hole by irradiating a second laser beam to the target substrate along the cutting line so as to be separated on a spot basis, and step S41 of forming a cutting crack by irradiating a third laser beam along the cutting line while scanning the target substrate may be performed.

In step S41, the third laser beam LB3 may be emitted from a third laser module LM3 and irradiated onto the target substrate SUB along the cutting line CL through a third optical system OS3. As a result, the cutting crack CH2 connecting the cutting holes CH1 to each other may be formed.

The beam spot of the third laser beam LB3 may have an energy profile having substantially the same shape as that of the beam spot LBS1 of the first laser beam LB1 described above. For example, when the third laser beam LB3 is irradiated along the cutting line CL while scanning, it may have a substantially uniform energy profile in a direction perpendicular to the cutting line CL.

The third laser module LM3 may emit a $CO_2$ laser. The third laser module LM3 may be substantially the same as the first laser module LM1 described above. The third optical system OS3 may control the optical path and energy profile of the third laser beam LB3 provided from the third laser module LM3 and may emit the third laser beam LB3 toward an irradiation target. The third optical system OS3 is a beam shaper that controls the energy profile of a beam spot and may include at least one optical element. For example, the third optical system OS3 may include at least one of a convex lens, a concave lens, a convex mirror, and a concave mirror, or a lens or a mirror formed of a combination thereof. For example, the third optical system OS3 may include a composite lens in which a convex lens and a concave lens are combined in one lens.

As described above, the third laser beam LB3 may be irradiated onto the target substrate SUB to connect adjacent cutting holes CH1 from among the plurality of cutting holes CH1. The cutting crack CH2 may be formed on the target substrate SUB by the third laser beam LB3. The cutting crack CH2 may be formed by propagating and developing the fine crack, which was generated when the cutting hole CH1 was formed, by the third laser beam LB3. A width W3 of the cutting crack CH2 may be smaller than the width W2 of the cutting hole CH1. When the cutting crack CH2 connects all of the plurality of cutting holes CH1, the dummy area DMA of the target substrate SUB may be separated and removed, and the hole HLE may be formed. In step S41, when the dummy area DMA of the target substrate SUB is separated and removed, the cutting hole CH1 may be changed to the above-described depression DT.

The hole HLE may be a hole (e.g., an opening) in (or surrounded by) the active area AAR for displaying an image formed in the display device 1 described above with reference to FIGS. 4 to 6. For example, the hole HLE may be formed in the target substrate SUB without physical contact by sequentially irradiating the first to third laser beams LB1, LB2, and LB3.

In the method for manufacturing the display device according to an embodiment, the hole HLE surrounded by the active area AAR for displaying an image may be formed without physical contact, and thus, damage that may occur to the display device 1 when the hole HLE is formed may be reduced or prevented.

Hereinafter, another embodiment of the display device 1 will be described. In the following description of the display device according to another embodiment, redundant parts of the description of the display device 1 according to an embodiment will be omitted and differences therebetween will be primarily described.

Figure 22:
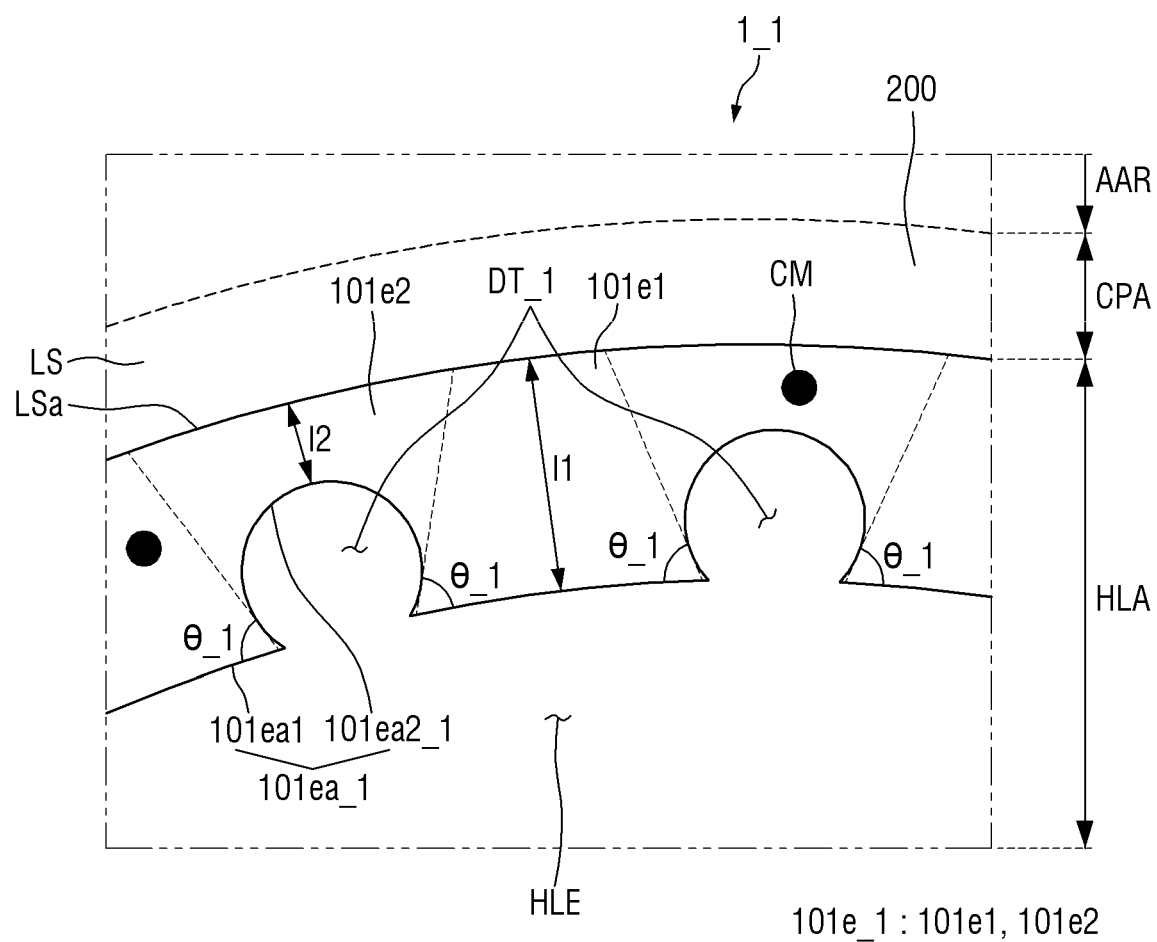
FIG. 22 is an enlarged view corresponding to the area R of FIG. 4 in a display device according to another embodiment.

FIG. 22 is an enlarged view corresponding to the area R of FIG. 4 in a display device according to another embodiment.

Referring to FIG. 22, the side surface 101ea_1 of a base substrate exposed portion 101e_1 included in a display device 1_1 according to the present embodiment may include the first side surface 101ea1 parallel to the side surface LSa of the stacked structure LS and a second side surface 101ea2_1 extending from the first side surface 101ea1 and depressed toward the active area AAR and the encapsulation area CPA. The second side surface 101ea2_1 may have an arc shape in plan view. For example, the planar shape of the second side surface 101ea2_1 may be a part of a circle. On the side surface 101ea_1 of the base substrate exposed portion 101e_1, the first side surface 101ea1 and the second side surface 101ea2_1 may be alternately disposed.

The second hole HLE2 may include a depression DT_1 surrounded by (e.g., partially surrounded or formed by) the second side surface 101ea2_1. The depression DT_1 may be a hole (e.g., an opening) penetrating the base substrate exposed portion 101e_1 in the thickness direction. The depression DT_1 may be formed by the base substrate exposed portion 101e_1 being depressed toward the active area AAR and the encapsulation area CPA.

In the display device 1_1 according to the present embodiment, a dihedral angle θ_1 may be formed between the first side surface 101ea1 and the second side surface 101ea2_1 extending from the first side surface 101ea1. In an embodiment, the dihedral angle θ_1 may be an acute angle. In the present embodiment, when the cutting hole CH1 is changed to the depression DT_1 by irradiating the third laser beam LB3, the dihedral angle θ_1 may be formed by irradiating the third laser beam LB3 to an area inside the existing cutting line CL. For example, the display device 1_1 according to the present embodiment may be formed by securing a sufficient process margin so as not to damage the active area AAR and the encapsulation area CPA when irradiating the third laser beam LB3.

The display device 1_1 according to the present embodiment may include the first hole HLE1 surrounded by (e.g., formed by) the stacked structure LS of which the side surface LSa produced by multiple laser processing processes has the first side inclination angle α, and the base substrate exposed portion 101e_1 of which the side surface 101ea_1 has the second side inclination angle β greater than the first side inclination angle α, thereby reducing or minimizing the encapsulation area CPA, increasing or maximizing the size of the active area AAR for displaying an image.

In addition, the display device 1_1 according to the present embodiment may sufficiently secure an irradiation process margin of the third laser beam LB3 during the manufacturing process, thereby making it easier to separate the dummy area DMA.

In concluding the detailed description, those skilled in the art will appreciate that many variations and modifications can be made to the embodiments described herein without substantially departing from the principles of the present disclosure. Therefore, the disclosed embodiments of the present disclosure are used in a generic and descriptive sense only and not for purposes of limitation.

What is claimed is:

1. A display device comprising:
a substrate having a first hole; and
a stacked structure on the substrate, the stacked structure having a second hole and an edge outside the first hole in a cross-sectional view,
wherein the first hole partially overlaps the second hole,
wherein the substrate has a substrate exposed portion exposed to the second hole, and
wherein the substrate exposed portion is partially depressed in an edge direction of the second hole,
wherein the substrate exposed portion has a first portion having a first distance from a side surface of the substrate exposed portion defining the first hole to a side surface of the stacked structure defining the second hole in a plan view and a second portion having a second distance from the side surface of the substrate exposed portion to the side surface of the stacked structure in the plan view, and
wherein the second distance is smaller than the first distance.

2. The display device of claim 1, wherein the first portion and the second portion of the substrate exposed portion are alternately arranged.

3. The display device of claim 1, wherein the side surface of the first portion and the side surface of the second portion have a curved shape in the plan view, and
wherein a curvature of the side surface of the first portion is smaller than a curvature of the side surface of the second portion.

4. The display device of claim 1, wherein a dihedral angle between the side surface of the second portion and the side surface of the first portion is an obtuse angle.

5. The display device of claim 1, wherein the substrate has a hole area overlapping the second hole, an active area at least partially extending around the hole area and being for displaying an image, and an encapsulation area between the hole area and the active area, wherein in the active area, the stacked structure comprises a circuit element layer on the substrate, a via layer on the circuit element layer and having a contact hole, a first electrode on the via layer and connected to the circuit element layer through the contact hole, a pixel defining layer on the first electrode and having an opening, a light emitting layer in the opening, a second electrode on the pixel defining layer and the light emitting layer, a first inorganic layer on the second electrode, a second inorganic layer on the first inorganic layer, and a first organic layer between the first inorganic layer and the second inorganic layer, and wherein in the encapsulation area, the stacked structure comprises a dam structure on the substrate, the first inorganic layer on the dam structure, the second inorganic layer on the first inorganic layer, and a second organic layer on the second inorganic layer.

6. The display device of claim 5, wherein the dam structure comprises a first structure on the substrate and on the same layer as the via layer and a second structure on the first structure and on the same layer as the pixel defining layer.

7. The display device of claim 5, wherein a top surface of the second organic layer in the encapsulation area is on the same plane as a top surface of the second inorganic layer in the active area.

8. The display device of claim 5, further comprising a carbide on the substrate exposed portion.

9. The display device of claim 8, wherein the stacked structure further comprises a polarization member on the second inorganic layer in the active area and on the second organic layer in the encapsulation area, and
   wherein the carbide is a material in which at least one of a material included in the second organic layer or a material included in the polarization member is carbonized.

10. The display device of claim 1, wherein a width of the second hole increases as it goes away from the substrate.

11. A display device comprising:
   a substrate having a first hole; and
   a stacked structure on the substrate, the stacked structure having a second hole and an edge outside the first hole in a cross-sectional view,
   wherein the first hole partially overlaps the second hole,
   wherein the substrate has a substrate exposed portion exposed to the second hole, and
   wherein the substrate exposed portion is partially-depressed in an edge direction of the second hole,
   wherein a bottom surface of the substrate exposed portion opposite to a surface on which the stacked structure is arranged and a side surface of the substrate exposed portion defining the first hole form a first angle, and
   wherein a top surface of the substrate exposed portion opposite to the bottom surface and a side surface of the stacked structure defining the second hole form a second angle smaller than the first angle.

12. A display device comprising:
   a substrate having a first hole and a substrate exposed portion adjacent to the first hole; and
   a stacked structure on the substrate, the stacked structure having a second hole, the first hole partially overlapping the second hole,
   wherein a first angle formed by a side surface of the substrate exposed portion defining the first hole and a bottom surface of the substrate exposed portion is greater than a second angle formed by a side surface of the stacked structure defining the second hole and a top surface of the substrate exposed portion.

13. The display device of claim 12, wherein the substrate has a hole area overlapping the second hole, an active area at least partially extending around the hole area and being for displaying an image, and an encapsulation area between the hole area and the active area,
   wherein in the active area, the stacked structure comprises a circuit element layer on the substrate, a via layer on the circuit element layer and having a contact hole, a first electrode on the via layer and connected to the circuit element layer through the contact hole, a pixel defining layer on the first electrode and including an opening, a light emitting layer in the opening, a second electrode on the pixel defining layer and the light emitting layer, a first inorganic layer on the second electrode, a second inorganic layer on the first inorganic layer, and a first organic layer between the first inorganic layer and the second inorganic layer, and
   wherein in the encapsulation area, the stacked structure comprises a dam structure on the substrate, the first inorganic layer on the dam structure, the second inorganic layer on the first inorganic layer, and a second organic layer on the second inorganic layer.

14. The display device of claim 13, wherein the stacked structure further comprises a polarization member on the second inorganic layer in the active area and on the second organic layer in the encapsulation area, and
   wherein a third angle formed by a bottom surface of the polarization member adjacent to the second inorganic layer and a side surface of the polarization member defining the second hole is smaller than the first angle.

15. The display device of claim 14, further comprising a carbide on the substrate exposed portion,
   wherein the carbide is a material in which at least one of a material included in the second organic layer or a material included in the polarization member is carbonized.

16. The display device of claim 13, wherein the dam structure comprises a first structure on the substrate and on the same layer as the via layer and a second structure on the first structure and on the same layer as the pixel defining layer.

17. The display device of claim 12, wherein a width of the first hole is smaller than a width of the second hole.

18. The display device of claim 12, wherein the substrate exposed portion does not overlap the stacked structure.

* * * * *